United States Patent
Tan et al.

(10) Patent No.: US 6,257,491 B1
(45) Date of Patent: Jul. 10, 2001

(54) PACKAGED MIRROR INCLUDING MIRROR TRAVEL STOPS

(75) Inventors: Chinh Tan, Bohemia; Miklos Stern, Flushing; Henry Grossfeld, Great Neck; Paul Dvorkis, Stony Brook; Peter Fazekas, Medford, all of NY (US)

(73) Assignee: Symbol Technologies, Inc., Holtsville, NY (US)

( * ) Notice: Subject to any disclaimer, the term of this patent is extended or adjusted under 35 U.S.C. 154(b) by 0 days.

(21) Appl. No.: 09/519,576

(22) Filed: Mar. 6, 2000

Related U.S. Application Data

(63) Continuation of application No. 08/631,364, filed on Apr. 12, 1996, which is a continuation-in-part of application No. 08/506,574, filed on Jul. 25, 1995, which is a continuation of application No. 08/141,342, filed on Oct. 25, 1993, now abandoned, said application No. 08/631,364, is a continuation-in-part of application No. 08/394,813, filed on Feb. 27, 1995, now Pat. No. 6,024,283.

(51) Int. Cl.[7] ........................................ G06K 7/10

(52) U.S. Cl. ........................ 235/462.36; 359/214

(58) Field of Search ............... 235/462.36, 462.33; 359/214

(56) References Cited

U.S. PATENT DOCUMENTS

| | | |
|---|---|---|
| 4,251,798 | 2/1981 | Swartz et al. . |
| 4,317,611 | 3/1982 | Petersen ............................. 359/214 |
| 4,369,361 | 1/1983 | Swartz et al. . |
| 4,387,287 | 6/1983 | Swartz et al. . |
| 4,409,470 | 10/1983 | Shepard et al. . |
| 4,421,381 | 12/1983 | Ueda et al. ........................ 359/214 |
| 4,760,248 | 7/1988 | Swartz et al. . |

(List continued on next page.)

FOREIGN PATENT DOCUMENTS

| | | |
|---|---|---|
| 0 425 844 | 5/1991 | (EP) . |
| 623888 | 11/1994 | (EP) ............................. 235/462 |
| 1-145622 | 6/1989 | (JP) . |
| WO 90/08364 | 7/1990 | (WO) . |

OTHER PUBLICATIONS

Borrelli et al., "Photolytic Techniques for Producing Microlenses in Photosensitive Glass", Applied Optics, vol. 24, No. 16, Aug. 15, 1985.

Popovic et al., "Technique for Monolithic Fabrication of Microlens Arrays", Applied Optics, vol. 27, No. 7, Apr. 1, 1988.

Schneider et al., "Efficient Room–Temperature Contiuous––Wave AlGAInP/AlGaAs Visible (670 mm) Vertical–Cavity Surface Emitting Lasser Diodes", IEEE Photonics Technology Letters, vol. 6, No. 3, Mar. 1994.

*Primary Examiner*—Mark Tremblay

(57) ABSTRACT

An integrated optical module for an optical scanner has a lens spaced from a vertical-cavity surface-emitting laser (VCSEL) by a spacer of defined dimensions. The module, in an alternative embodiment, includes a wafer frame, a suspended mirror mounted for oscillation on the frame, a wafer substrate bonded beneath the frame and a wafer cover bonded above the frame. The cover includes a mirror travel stop to protect the mirror against shocks. A VCSEL mounted to the wafer cover produces a beam which is shaped and deflected by a diffractive optical element onto the oscillating mirror. The reflected beam passes out of the module toward an indicia to be read. Large numbers of such devices may be fabricated relatively cheaply using wafer-scale processing and assembly technology. Three large wafers are fabricated corresponding respectively to arrays of substrates, frames and covers. The large wafers are bonded together in a sandwich arrangement, and are then diced to produce the individual scan modules. The modules may provide either one-dimensional or two-dimensional scanning.

19 Claims, 15 Drawing Sheets

U.S. PATENT DOCUMENTS

| | | |
|---|---|---|
| 4,760,428 | 7/1988 | Watanabe et al. . |
| 4,896,026 | 1/1990 | Krichever et al. . |
| 4,956,619 | 9/1990 | Hornbeck ............................ 359/317 |
| 5,016,072 | 5/1991 | Greiff . |
| 5,144,120 | 9/1992 | Krichever et al. . |
| 5,202,785 | 4/1993 | Nelson ................................ 359/214 |
| 5,210,398 | 5/1993 | Metlitsky . |
| 5,258,605 | 11/1993 | Metlitsky et al. . |
| 5,266,794 | 11/1993 | Olbright et al. . |
| 5,283,447 | 2/1994 | Olbright et al. . |
| 5,285,455 | 2/1994 | Tong et al. . |
| 5,319,496 | 6/1994 | Jewell et al. . |
| 5,326,386 | 7/1994 | Lee et al. . |
| 5,396,054 | 3/1995 | Krichever et al. . |
| 5,519,198 | 5/1996 | Plesko ................................... 235/462 |
| 5,536,926 | 7/1996 | Ikeda et al. .......................... 235/462 |
| 5,543,956 | 8/1996 | Nakagawa et al. .................. 359/225 |
| 5,579,148 | 11/1996 | Nishikawa et al. .................. 235/472 |
| 5,629,790 | 5/1997 | Neukermans et al. ............... 359/158 |
| 5,696,862 | 12/1997 | Hauer et al. . |
| 6,014,240 | 1/2000 | Floyd et al. ......................... 359/201 |
| 6,099,132 * | 8/2000 | Kaeriyama ........................... 359/872 |

* cited by examiner

PACKAGED MIRROR INCLUDING MIRROR TRAVEL STOPS

This is a continuation of U.S. patent application Ser. No. 08/631,364,filed Apr. 12, 1996, which is a continuation-in-part of U.S. patent application Ser. No. 08/506,574, filed Jul. 25, 1995, which is a continuation of U.S. patent application Ser. No. 08/141,342, filed Oct. 25, 1993, and now abandoned. U.S. patent application Ser. No. 08/631,364 is also a continuation-in-part of U.S. patent application Ser. No. 08/394,813, filed Feb. 27, 1995, which is now U.S. Pat. No. 6,024,283. U.S. patent application Ser. No. 08/631,3,64 is related to U.S. patent application Ser. No. 08/483,163, filed Jun. 7, 1995, now U.S. Pat. No. 5,966,230, which is a divisional of U.S. patent application Ser. No. 08/141,342, filed Oct. 25, 1993, and now abandoned all of which are incorporated herein by reference.

BACKGROUND OF THE INVENTION

1. Field of the Invention

The invention relates to optical scanners and in particular to a novel miniature scan engine/module for such scanners, preferably but not necessarily using wafer technology and incorporating a vertical cavity surface emitting laser diode (VCSEL). The invention further extends, more generally to an integrated optical module using VCSEL technology.

2. Description of the related art

Various optical readers and optical scanning systems have been developed heretofore for reading indicia such as bar code symbols appearing on a label or on the surface of an article. The bar code symbol itself is a coded pattern of indicia comprised of a series of bars of various widths spaced apart from one another to bound spaces of various widths, the bars and spaces having different light reflecting characteristics. The readers in scanning systems electro-optically transform the graphic indicia into electrical signals, which are decoded into alphanumeric characters that are intended to be descriptive of the article or some characteristic thereof. Such characteristics are typically represented in digital form and utilized as an input to a data processing system for applications in point-of-sale processing, inventory control and the like. Scanning systems of this general type have been disclosed, for example, in U.S. Pat. Nos. 4,251,798; 4,369,361; 4,387,297; 4,409,410; 4,760,428; and 4,896,026, all of which have been assigned to the same assignee as the instant application. As disclosed in some of the above patents, one embodiment of such a scanning system resides, inter alia, in a hand held, portable laser scanning device supported by a user, which is configured to allow the user to aim the scanning head of the device, and more particularly, a light beam, at a targeted symbol to be read.

The light source in a laser scanner bar code reader is typically a gas laser or semiconductor laser. The use of semiconductor devices as the light source is especially desirable because of their small size, low cost and low voltage requirements. The laser beam is optically modified, typically by an optical assembly, to form a beam spot of a certain size at the target distance. It is preferred that the cross section of the beam spot at the target distance be approximately the same as the minimum width between regions of different light reflectivity, i.e., the bars and spaces of the symbol. At least one bar code reader has been proposed with two light sources to produce two light beams of different frequency.

One laser-based bar code scanner relevant to the present invention is disclosed in U.S. Pat. No. 5,144,120 to Krichever et al. which employs laser, optical and sensor components in conjunction with a so-called "mirrorless" scanner arrangement. One or more of these components are mounted on a drive for repetitive reciprocating motion either about an axis or in a plane to effect scanning.

Another proposed bar code scanner employs electronic means for causing the light beam to scan a bar code symbol, rather than using a mechanical device. A linear array of light sources activated one at a time in a regular sequence may be imaged upon the bar code symbol to simulate a scanned beam. Instead of a single linear array of light sources, a multiple-line array may be employed, producing multiple scan lines. Such a scanner is disclosed in U.S. Pat. No. 5,258,605 to Metlitsky et al.

Typically, the semiconductor lasers used in such bar code scanners is an edge-emitting injection laser in which the laser beam is emitted from the p-n junction region on a polished end face of the device.

By their physical nature, these known edge-emitting injection lasers emit a beam from a thin region at the p-n junction. A laser beam emanating from a thin source has a large beam divergence which makes focusing difficult and results in a wide range of variability in performance from laser to laser.

A more recently developed form of semiconductor laser is the vertical-cavity surface-emitting laser diode (VCSEL), such as described in "Efficient Room-Temperature Continuous-Wave AlGaInP/AlGaAs Visible (670 nm) Vertical-Cavity Surface Emitting Laser Diodes" by R P Schneider et al. published in IEEE Photonics Technology Letters, Vol. 6, No. 3, March 1994. Reference is also made to U.S. Pat. Nos. 5,283,447; 5,285,455; 5,266,794; 5,319, 496; and 5,326,386, which are hereby incorporated by reference, for background information.

The VCSEL has a substantial surface area from which the laser beam is emitted; this area may be patterned. Thus, the beam produced is less divergent in one dimension than with known edge-emitting type semiconductor laser diodes. The output beam is round, and is virtually not astigmatic. Furthermore, VCSELs typically operate at significantly lower currents than edge-emitting laser diodes. Therefore, it also generates less heat.

In the laser beam scanning systems known in the art, a single laser light beam is directed by a lens or other optical components along the light path toward a target that includes a bar code symbol on the surface. The moving-beam scanner operates by repetitively scanning the light beam in a line or series of lines across the symbol by means of motion or a scanning component, such as the light source itself or a mirror disposed in the path of the light beam. The scanning component may either sweep the beam spot across the symbol and trace a scan line across the pattern of the symbol, or scan the field of view of the scanner, or do both.

Bar code reading systems also include a sensor or photodetector which detects light reflected or scattered from the symbol. The photodetector or sensor is positioned in the scanner in an optical path so that it has a field of view which ensures the capture of a portion of the light which is reflected or scattered off the symbol, detected, and converted into an electrical signal. Electronic circuitry and software decode the electrical signal into a digital representation of the data represented by the symbol that has been scanned. For example, the analog electrical signal generated by the photodetector is converted by a digitizer into a pulse or modulated digitized signal, with the widths corresponding to the physical widths of the bars and spaces. Such a digitized signal is then decoded, based on the specific symbology used by the symbol, into a binary representation of the data encoded in the symbol, and subsequently to the alpha numeric characters so represented.

The decoding process of known bar code reading system usually works in the following way. The decoder receives the pulse width modulated digitized signal from the digitizer, and an algorithm. implemented in the software, attempts to decode the scan. If the start and stop characters and the characters between them in the scan were decoded successfully and completely, the decoding process terminates and an indicator of a successful read (such as a green light and/or an audible beep) is provided to the user. Otherwise, the decoder receives the next scan. performs another decode attempt on that scan, and so on, until a completely decoded scan is achieved or no more scans are available.

Such a signal is then decoded according to the specific symbology into a binary representation of the data encoded in the symbol, and to the alphanumeric characters so represented.

Moving-beam laser scanners are not the only type of optical instruments capable of reading bar code symbols. Another type of bar code reader is one which incorporates detectors based on solid state imaging arrays or charge coupled device (CCD) technology. In such prior art readers the sides of the detector are typically smaller than the symbol to be read because of the image reduction by the objective lens in front of the array or CCD. The entire symbol is flooded with light from a light source such as lighting light emitting diodes (LED) in the scanning device, and each cell in the array is sequentially read out to determine the presence of a bar or a space in the field of view of that cell.

The working range of CCD bar code scanners is rather limited as compared to laser-based scanners and is especially low for CCD based scanners with an LED illumination source. Other features of CCD based bar code scanners are set forth in U.S. Pat. No. 5,396,054 which is hereby incorporated by reference, and in U.S. Pat. No. 5,210,398. These references are illustrative of the certain technological techniques proposed for use in CCD type scanners to acquire and read indicia in which information is arranged in a two dimensional pattern.

SUMMARY OF THE INVENTION

It is an object of the present invention to provide an integrated optical module, preferably although not necessarily for use within an optical scanner, which is not only robust in use but which can be manufactured in large quantities relatively inexpensively.

In accordance with this object, the invention extends to an integrated optical module having a VCSEL which is spaced from an MOE or a refractive or diffractive lens by a spacer of predetermined dimensions. During manufacture, the dimensions of the spacer may be chosen so that the laser beam is appropriately focused by the optics according to the desired application.

Such modules may conveniently be manufactured using wafer-scale processing and assembly technology. Using this approach, a wafer array of spacers is bonded within a sandwich formed by a wafer array of MOEs on one side and a wafer array of VCSELs on a substrate on the other. Once the sandwich has been bonded or otherwise secured together, it may be cut up or diced into the required modules. Prior to dicing, the VCSELs making up the array on the substrate may be individually tested. Another approach is to dice the VCSELs initially, and then flip-chip mount them on the optical substrate. Electrical contacts can be established via solder bumps.

The sandwich may be diced into individual modules, each containing exactly one VCSEL, or it may be diced into larger units, each including a plurality of VCSELs in an array, for example for redundancy, multiple-ranging, time multiplexing, additional power or beam shaping.

It is a further object of the invention to provide a miniaturized scan engine or module for an optical scanner that is small, robust, and relatively inexpensive. It is a further object to provide a scan engine in which the current required for operation is reduced.

The general concept of the present invention, in one arrangement, comprises a scan engine, module or micromirror package in a sandwich structure consisting of a top cap, a bottom substrate, and a mirror in between. The scan engine may be manufactured in a batch process, for instance by micro-machining. The top cap and bottom substrate contain features to limit mirror travel so that the mirror hinges are protected against impact, and one of the wafers may include or comprise an MOE, thereby defining an optics layer. To facilitate assembly, the sandwich may be laminated on the wafer scale, and then diced into individual cells. Electrodes and access means are provided both to actuate the mirror and to sense the mirror position. In addition, in some embodiments a transparent cover is provided to protect the mirror, with clear electrodes either for electrostatic actuation of the mirror or for use in detecting mirror position. To minimise overall package height, thin wafers are used.

Each of the wafers is made of an appropriate material, such as plastics or silicon for the upper and lower wafers and silicon for the central wafer. Metal portions are added by printing, coating, or any other convenient means. For large scale manufacture, micromachining, micro-injection molding, compression-injection molding and stamping are likely to be the most cost effective processes. The general approach described in Borgesen et al, Materials Research Society Symposium Proceedings.

Vol. 323,1994, may be used.

The optics layer may be omitted, in some embodiments with focusing of the VCSELs being provided by a suitable shaping (for example by etching or electron beam writing) of the VCSEL aperture itself, or of the mirror surface.

The invention also relates to a scan engine in which the mirror is actuated using the shape memory effect, for example in TiNi hinges. The amount of current needed to heat the hinges is reduced by providing an electrically conductive coating on those portions of the hinges which do not substantially contribute to the movement. Typically, this means coating a central portion of each hinge with a conductive coating, and leaving the end portions uncoated. The mirror may also be actuated (particularly but not exclusively in a cantilever arrangement) by applying heat to a bi-metallic beam, or by electrostatic control. Piezo-electric control is also a possibility.

Preferred embodiments of the invention may include a micro-optical element to condition the laser beam. "Micro-optical elements" (MOEs) in the context of this patent application refer to a single or an array of optical elements that rely on micro fabrication techniques, based on refraction, reflection, diffraction or a combination of the above effects, to modify, direct or transform the laser beam; and the substrate is not limited to glass. Examples of MOEs include: micro-refractive optics generated thermally, photolytically, stamping, molding, etching; diffractive optics generated by diamond turning, stamping, embossing, directed ion or electron beam writing, photolithography, molding; computer or optically generated holographic optics. These elements can be transmissive or reflective.

BRIEF DESCRIPTION OF THE DRAWINGS

The foregoing objects and advantages of the present invention may be more readily understood by one skilled in the art with reference to the following detailed description of referred embodiments, taken in conjunction with the accompanying drawings, in which.

DETAILED DESCRIPTION OF THE PREFERRED EMBODIMENTS

FIGS. 1 to 4 show, in highly simplified and schematic form, some embodiments of scan engines/modules in accordance with the present invention. The modules shown are general purpose optical scanning modules which are suitable for a number of applications including, for example, bar code readers.

Figure 1:
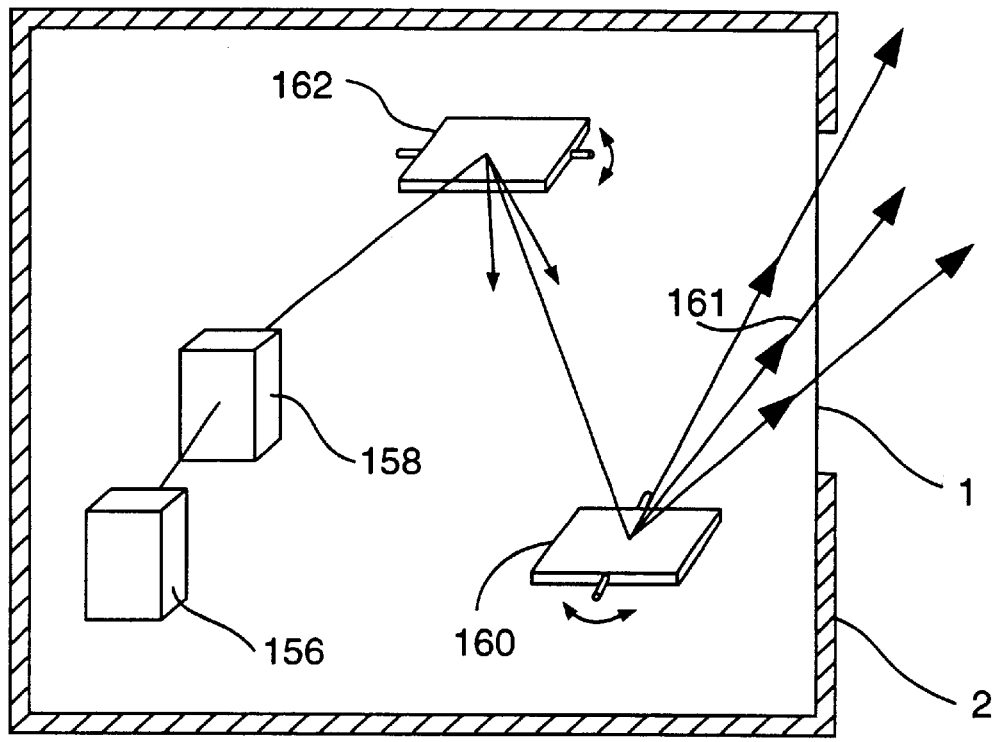
FIG. 1 shows a two-dimensional scanner according to an embodiment of the invention using two micromachined mirrors.

In FIG. 1, light from a VCSEL (vertical cavity surface emitting laser diode) 156 is shaped and deflected by a micro-optical element (MOE). As previously mentioned, "micro-optical elements" (MOEs) in the context of this patent application refer to a single or an array of optical elements that rely on micro fabrication techniques, based on refraction, reflection. diffraction or a combination of the above effects, to modify, direct, or transform the laser beam: and the substrate is not limited to glass. Examples of MOEs include: micro-refractive optics generated thermally, photolytically, stamping, molding, etching, diffractive optics generated by diamond turning, stamping, embossing, directed ion or electron beam writing, photolithography, molding; computer or optically generated holographic optics. These elements can be transmissive or reflective. The MOE combines the functions of focusing, beam direction bending and some aberration or scan beam quality correction. The beam is then directed to a first mirror 162, scanning in the y direction, and then a second mirror 160, scanning in the x direction, to produce a two-dimensional scanning beam 161 which is directed via a window 1 in a housing 2 to an indicia (not shown) to be read. Reflected light from the indicia is detected by a photodetector (not shown) and digitized/decoded to interpret the indicia.

The order of the mirrors can be reversed, i.e. the first may scan in the x-direction and the second in the y-direction. Alteratively, a single 2D mirror can be used; 2D scanning may also be accomplished by a single cantilever structure.

Figure 2:
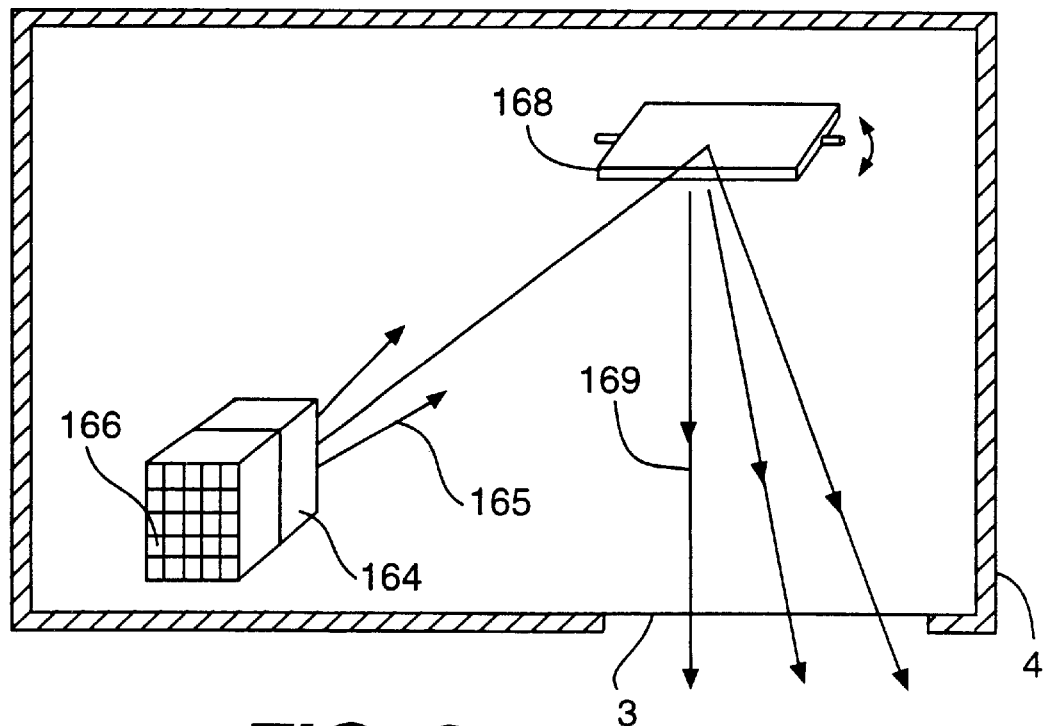
FIG. 2 shows another embodiment using only one micromachined mirror but with an array of VCSELs that are turned on and off in a time-multiplexed manner.

FIG. 2 shows a VCSEL array 166 and, in front of it, a MOE array 164. The VCSELs are turned on and off in a time multiplexed manner, thereby creating a beam 165 (or more properly a series of beams) which scans in the y direction. These beams are then incident upon an oscillating mirror 168, scanning in the x direction, to provide a two-dimensional scanning beam 169. This leaves a scanner housing 4 via a window 3 in a direction towards an indicia (not shown) to be scanned. Alternatively, reference numeral 166 may represent a laser array, and 164 an optical element and switching array. In this alternative, the laser array 166 is left on at all times, with the switching array 164 determining which beam or parts of the beam are allowed to pass. The switching array is sequentially actuated so that each optical element in the array in turn bends and/or focuses the beam. Since each optical element bends and/or focuses to a different extent, the resultant composite effect is of a single beam which scans in one direction.

Figure 3:
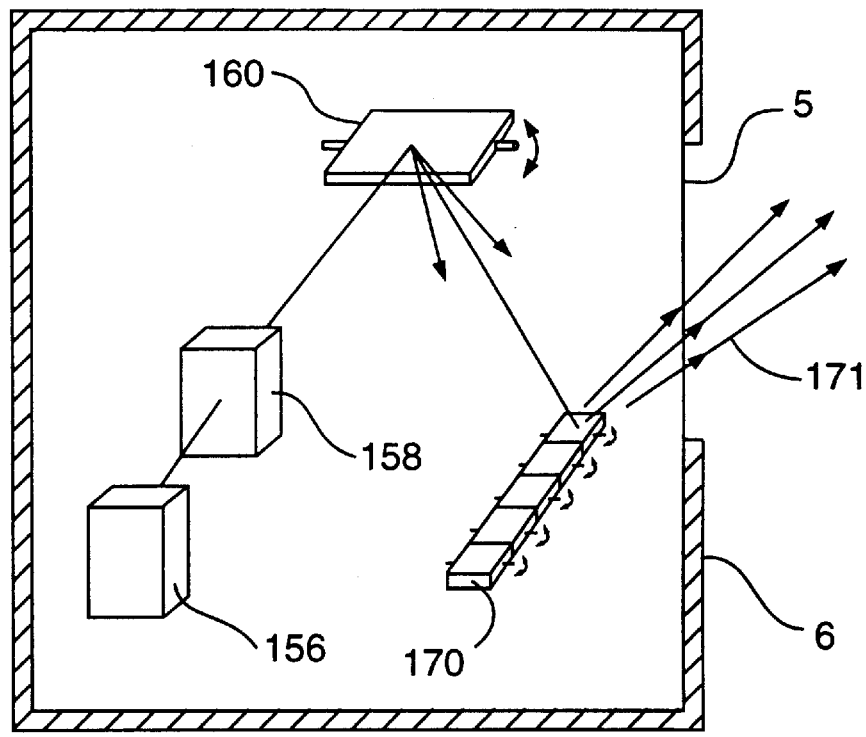
FIG. 3 shows another embodiment including an array of individual small mirrors.

FIG. 3 corresponds generally to FIG. 1, except that the second oscillating mirror 160 is replaced by an array 170 of smaller mirrors or "micro-mirrorlets". These smaller mirrorlets each scan in the same x direction, but are timed to be synchronous with the y scanning direction provided by the mirror 160. The advantage of smaller mirrors is higher frequency, lower cost and possibly lower drive power. Again, the result is a beam 171 which scans in two dimensions. As before, the beam 171 leaves a scanner housing 6 via a window 5 towards an indicia (not shown) to be scanned.

Figure 4A:
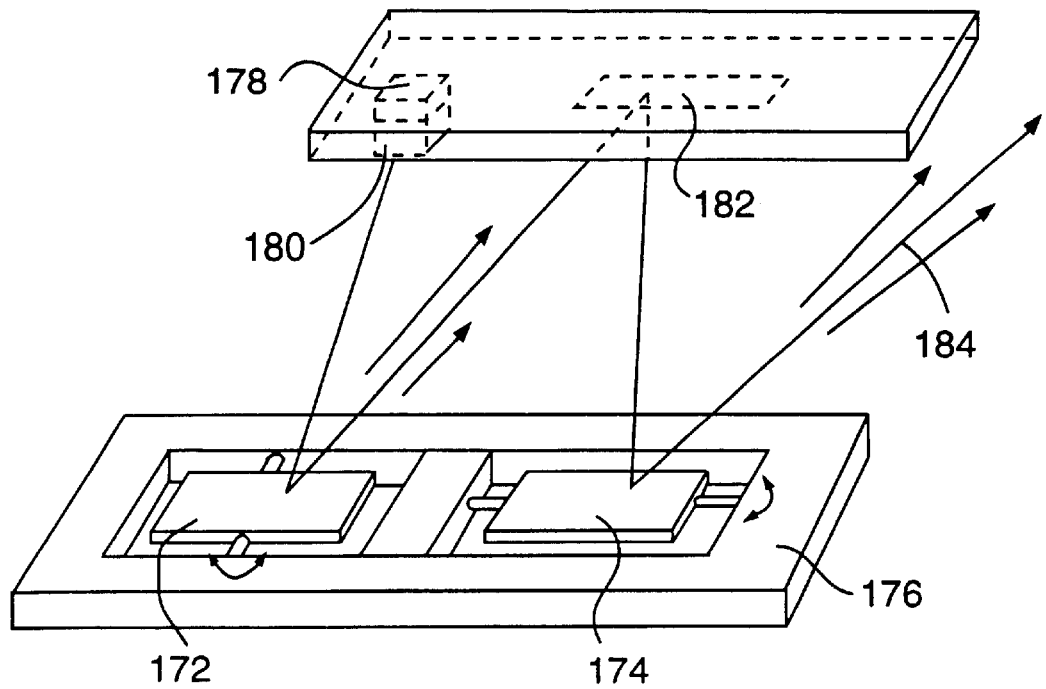
FIG. 4A shows yet another embodiment using two mirrors which are mounted on the same substrate but which scan in orthogonal directions.

FIG. 4A shows yet another embodiment using two mirrors 172,174 mounted on a common substrate 176, but scanning in orthogonal directions. Light from a VCSEL 178 passes through a MOE 180 and is incident upon the first mirror 172. It is then reflected to a folding mirror 182 and back to the second mirror 174 to provide a two-dimensionally scanning outgoing beam 184. By mounting both mirrors 172 and 174 onto a common substrate, alignment problems may be reduced.

Figure 4B:
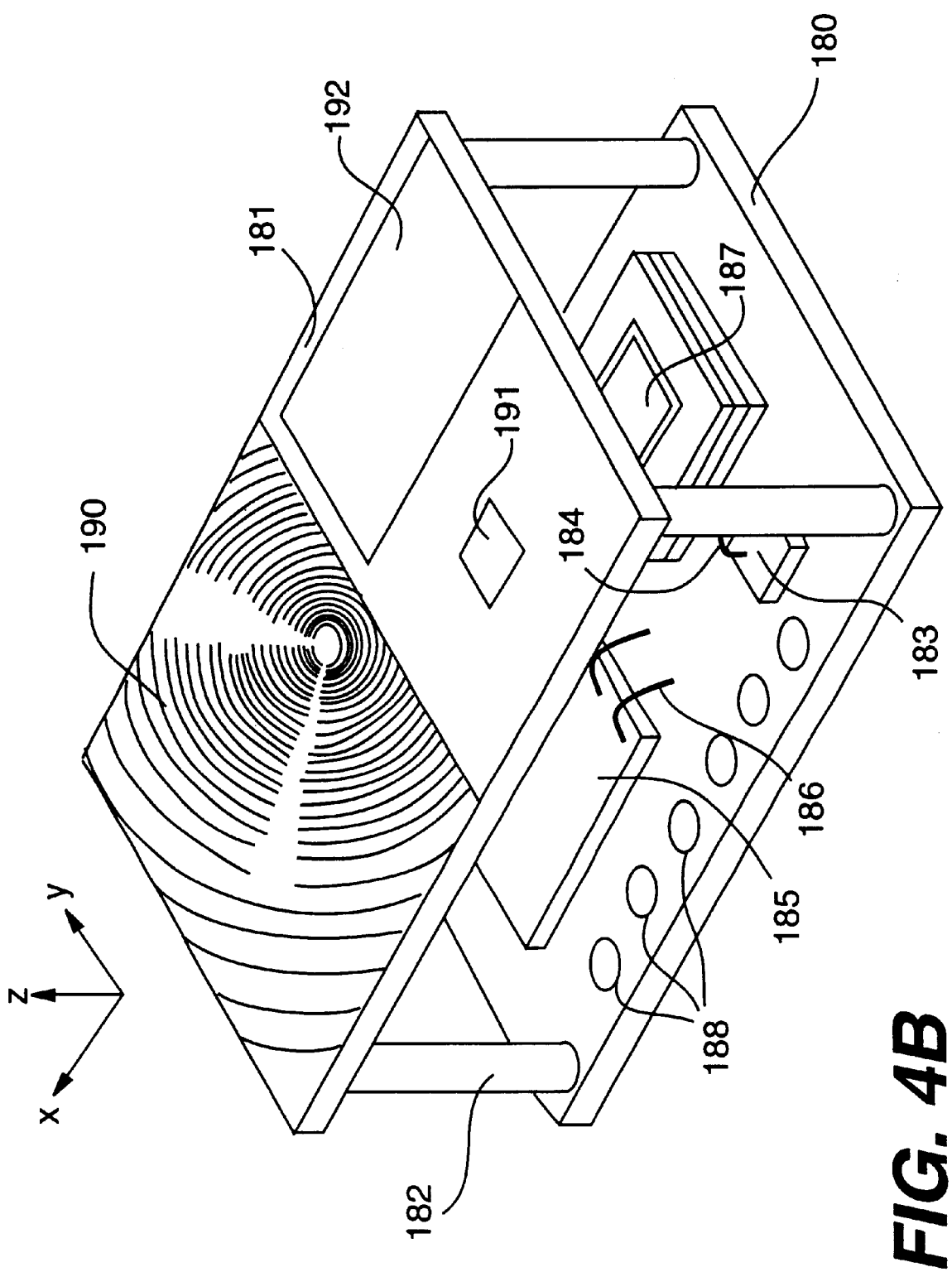
FIG. 4B shows yet another embodiment.

FIG. 4B shows a practical embodiment of some of the ideas previously mentioned in connection with FIGS. 1 to 4A. The scanner assembly shown in FIG. 4B has ceramic or plastic lower and upper substrates 180, 181, the distance between them being defined by spacers 182. Mounted on the lower substrate 180 is a VCSEL 183 with leads 184, a detector 185 with leads 186, a lower mirror 187, and interconnect pads 188. The upper substrate 181 includes collector optics 190, an upper downwardly-directed mirror 191 and a window 192 through which the outgoing scan beam passes. The electrical interconnect pads 188 provide electrical connections through the leads 184 to the VCSEL and through the leads 186 to the detector. Electrical control leads (not shown) are also provided to the lower mirror 187 and to the upper mirror 191.

In operation, the VCSEL 183 produces a laser beam (not shown) which is directed onto the upper mirror 191. This is mounted for oscillation as discussed in FIGS. 1 to 3 so that the reflected beam scans in the X direction. The reflected scanning beam then impinges upon the lower mirror 187, which is mounted for scanning motion in the Y direction. The resulting beam, scanning in both directions, passes out of the module through the window 192 towards an indicia (not shown) to be scanned. Light reflected from the indicia is collected by the collector optics 190 and is detected by the detector 185. The electrical output produced by the detector passes through the lines 186 to the interconnect pads 188 from which the signal may be passed on to a digitiser and if necessary to a decoder.

The embodiments of FIGS. 1 to 4 include, in each case, a VCSEL with an optical element positioned in front of it. FIGS. 5 to 8 show some exemplary embodiments showing how such VCSELs and optical arrangements may be fabricated using wafer-scale fabrication techniques and MOEs.. It will be understood, of course, that the embodiments described in FIGS. 5 to 8 are suitable for, but are not restricted to use with, FIGS. 1 to 4. The FIG. 5 to 8 embodiments emerge from a recognition of the overall desirability of VCSELs in this application due to low operating power, aperture control, and the potential of wafer-scale fabrication. In addition, the applicants have discovered that if the VCSELs are appropriately positioned within a suitable optical arrangement, active focusing may in some circumstances be dispensed with.

Figure 5:
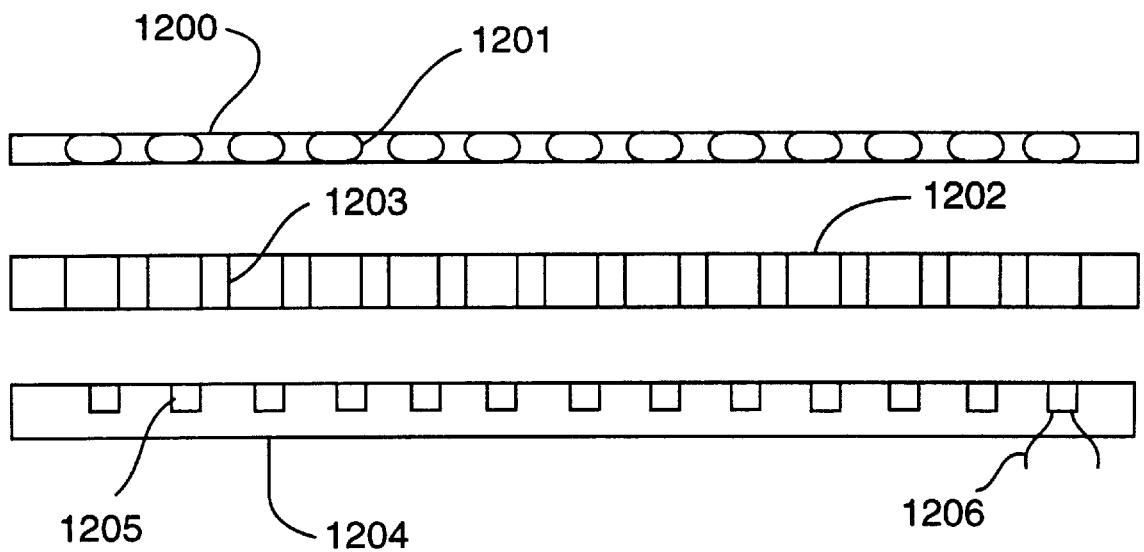
FIG. 5 shows an exemplary micro-optics array.

Turning first to FIG. 5, there is shown an upper wafer 1200, a central wafer 1202 and a lower wafer 1204. Each wafer may be manufactured using conventional wafer scale fabrication technology. To understand the typical size and shape of such wafer, reference should be made to FIG. 13 which shows the overall configuration, although in connection with some other specific wafers to be described later.

The upper wafer 1200 comprises a two-dimensional micro-lens array or MOE array having a large number of individual lenses 1201. The lenses may be either refractive lenses, diffractive lenses or both. The wafer may be formed by any convenient technique such as silicon micromachining, injection molding, stamping, casting, extruding, electrostatic discharge or computer numerical control machining and so on. The material of which it is formed is not critical, but the lenses 1201 of course have to be of a material which can pass a visible VCSEL light beam. The central wafer 1202 acts as a spacer, and is conveniently fabricated from a semiconductor material such as silicon. The silicon is cut to the desired thickness and then etched with a two-dimensional array of apertures separated by spacing columns 1203. The apertures may be cut, punched or preferably etched through the wafer. The lower wafer 1204 is formed with a two-dimensional array of VCSELs 1205 to each of which wire bonds 1206 are attached.

Figure 13:
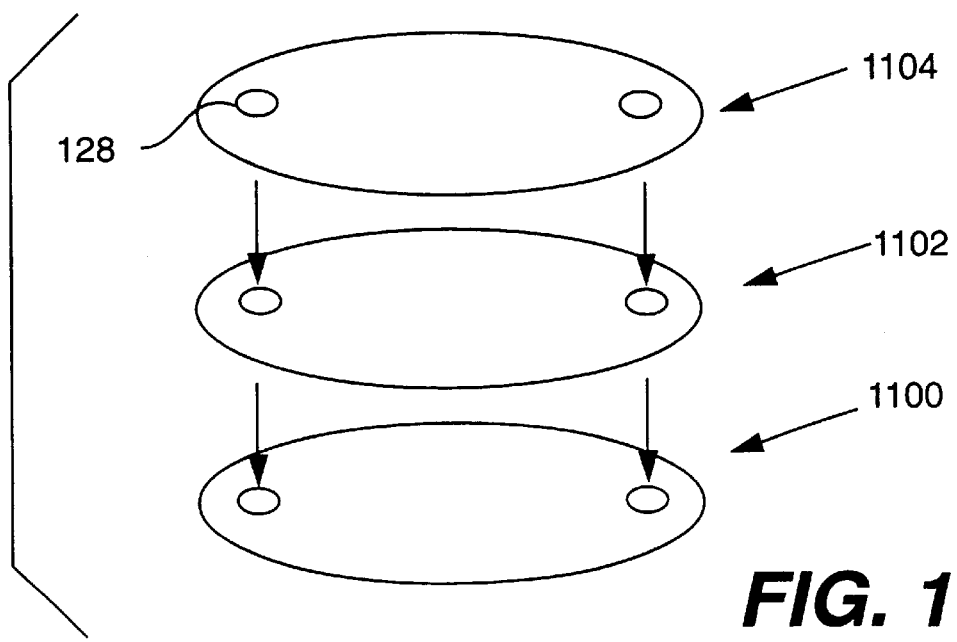
FIG. 13 illustrates a wafer bonding technique for manufacturing miniature scan engine packages.

Once the three wafers have been fabricated, they are aligned (for example using pins passing through alignment holes like the holes 128 shown in FIG. 13) and then bonded together. The bonding may be carried out in any convenient manner including the use of precut or preformed adhesive films, liquid adhesives, solder bumping or anodic bonding. The bonded wafers are then diced into individual VCSEL/ optics packages. For use in the embodiments of FIGS. 1, 3 and 4, each individual package will contain a single VCSEL and a single lens 1201, suitably spaced from the VCSEL by the spacers 1203. The height of the spacer 1203 is chosen according to the application to provide suitable focusing by the lens 1201. For the embodiment of FIG. 2, the bonded wafers will be diced into larger blocks, each including within it a one or two-dimensional array of VCSELs and a two-dimensional array of lenses.

An advantage of wafer-scale fabrication, as described, is that the individual VCSELs 1205 in the lower wafer 1204 may be tested separately before dicing. A record is kept of the position of any VCSELs which do not operate correctly, and the corresponding packages including those VCSELs are discarded at the end of the procedure.

In a variant of the embodiment of FIG. 5, the upper and central wafers could be combined into a single wafer which includes both the lenses 1201 and the spacers 1203. This could be achieved, for example, by the use of a precision glass or high temperature molded plastics wafer having an array of through holes.

Figure 6:
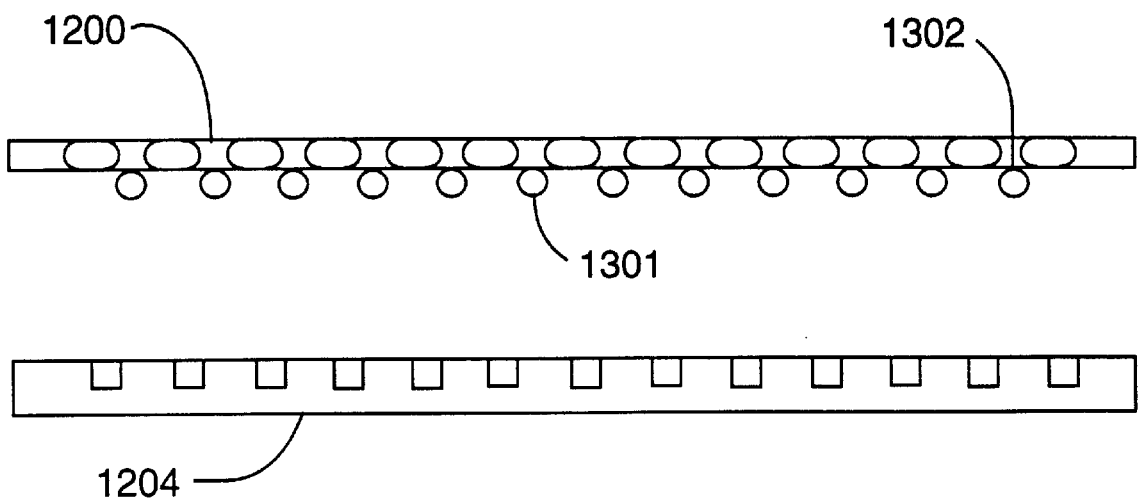
FIG. 6 shows another exemplary micro-optics array.

FIG. 6 shows another possibility in which the central wafer 1202 is replaced with miniature glass beads 1301 which act as the spacer between the lens wafer 1200 and the VCSEL wafer 1204. Selected areas 1302 of the lens wafer are chemically etched into small cups or depressions into which the beads 1301 sit. The glass beads and the lens wafer 1200 are then fused, and the assembly is then bonded as described above to the wire bonded VCSEL wafer 1204.

Figure 7:
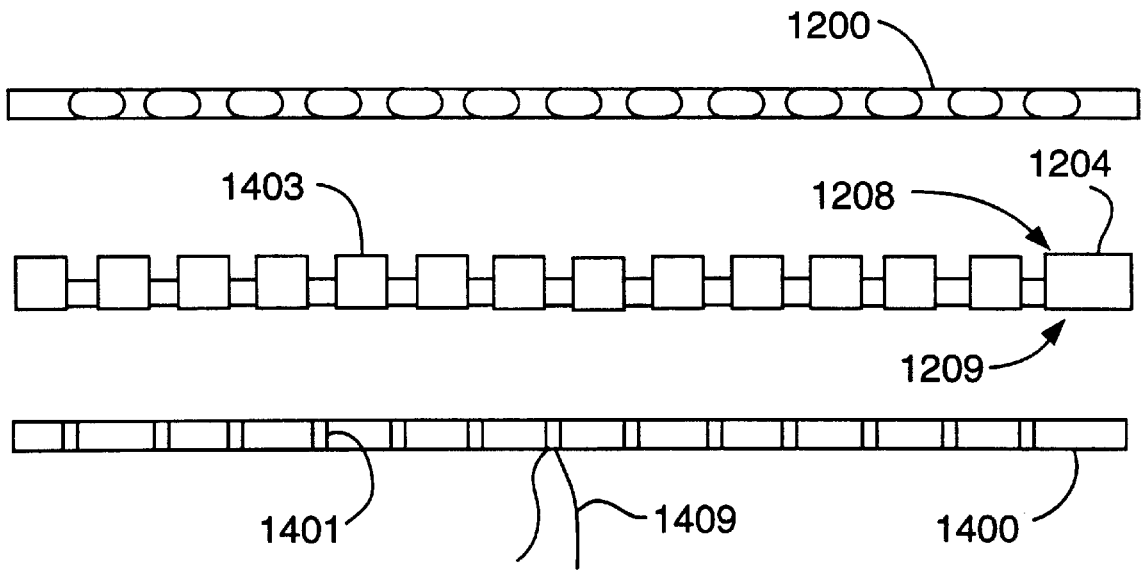
FIG. 7 shows another exemplary micro-optics array.

In FIG. 7, a modified VCSEL wafer 1404 is used, this being upside down as shown in the drawing when compared with the corresponding VCSEL wafers 1204 of FIGS. 5 and 6. The surface 1209 of the wafer which is now at the bottom (that is the junction side) is first bonded to a silicon detector wafer 1400, or to any other suitable substrate. Selected areas on which is now the upper surface 1208 of the VCSEL wafer are now thinned or etched down so that the laser energy emitted in the upper direction will no longer be absorbed by the substrate. The areas 1403 that are not thinned down become the spacers for the lens wafer 1200. The detector wafer 1400 comprises a two-dimensional array of individual detectors 1401, each detector being associated with one of the VCSELs on the VCSEL wafer. Once the sandwich has been bonded and diced into individual packages, the detectors 1401 provide feedback on the output intensity of its corresponding VCSEL. Wires 1409 provide the respective feedback signal for each of the individual detectors.

Figure 8A:
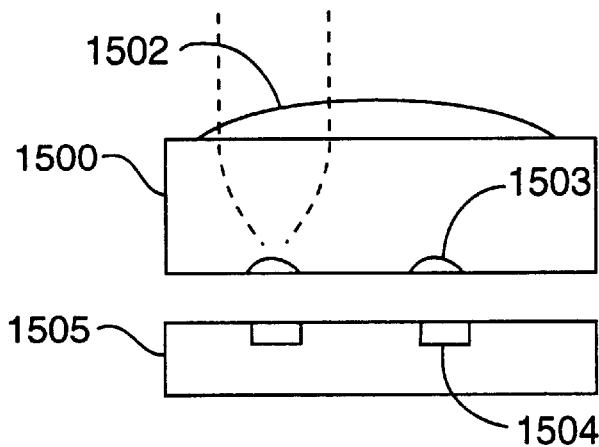
FIG. 8A is a schematic section through yet another exemplary micro-optics array.
Figure 8B:
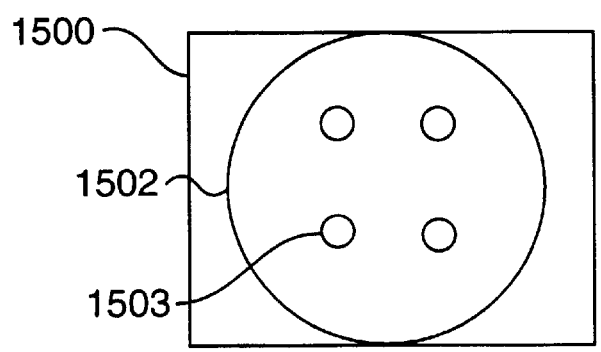
FIG. 8B is a top view of the micro-optics array of FIG. 8A.

Yet another alternative is shown in FIGS. 8A and 8B, the former being a schematic section through another exemplary array, and the latter being a top view. In this embodiment, the upper wafer 1500 is formed on its upper surface with a macro-lens 1502 and on its lower surface with an array of micro-lenses 1503. These lenses 1503 correspond with an array of VCSELs 1504 on the lower wafer 1505. In operation, each of the micro-lenses expands the laser beam from its corresponding VCSEL, while the macro-lens 1502 then acts to collimate the beam. Such an arrangement offers significant flexibility, in that altering the micro-lens power can vary the beam focus profile, while appropriately shaping the micro and/or macro lenses allows the designer to achieve oval beam profiles which may be optimised for particular applications. Typically in this arrangement the macro-lens may be around 0.5 mm in diameter, with the micro-lenses around 50 μm in diameter. The upper wafer 1500 may be fabricated as a MOE.

Figure 19A:
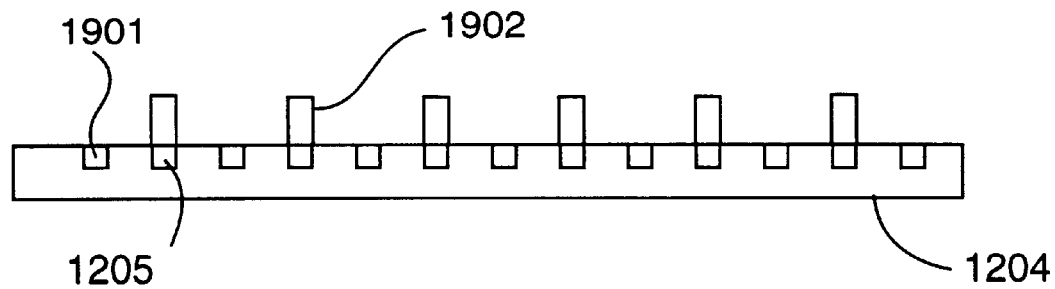
FIGS. 19A and 19B show alternative micro-optics arrays to those shown in FIGS. 5 to 8.
Figure 19B:
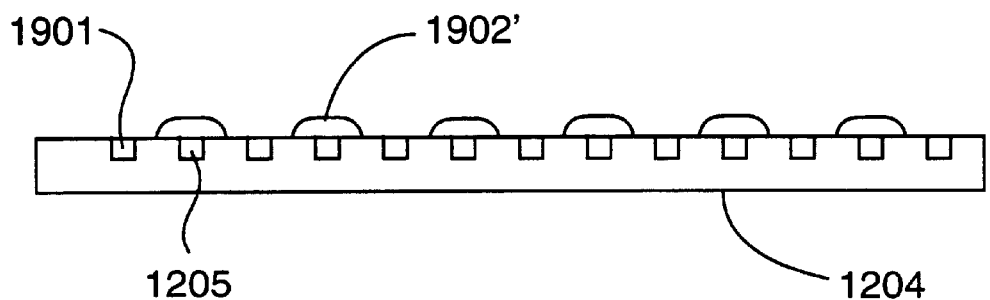

A further alternative embodiment will now be described with reference to FIGS. 19 and 20. FIG. 19A shows the VCSELs 1205 secured on the substrate 1204 and, between the VCSELs wire bonding pads 1901. Above the substrate 1204 is a lens wafer or MOE 1902. This layer may be fabricated in a manner similar to that disclosed for the fabrication of refractive microlenses in "Photolytic technique for producing microlenses in photosensitive glass", Borrelli et al, Applied Optics, Vol. 24. No. 16, 15 August 1985, or "Technique for monolithic fabrication of microlens arrays", Popovic, Applied Optics, Vol. 27, No. 7, 1 April 1988. However, instead of being manufactured as a monolithic lens wafer, the microlens material is first patterned or alternatively precisely dispensed to cover only the VCSELs 1205 but not the wire bonding pads 1901. This is the state of manufacture shown in FIG. 19A. The entire VCSEL wafer with the lensing material on it is then processed by heating or exposure to light. This process causes the lensing material to take up the form of individual lenses 1902', as shown in FIG. 19B. It also causes the lensing material to harden in that configuration, with the lenses over the apertures of the VCSELs 1205, while leaving space between the VCSELs for the wire bonding pads 1901.

Figure 20:
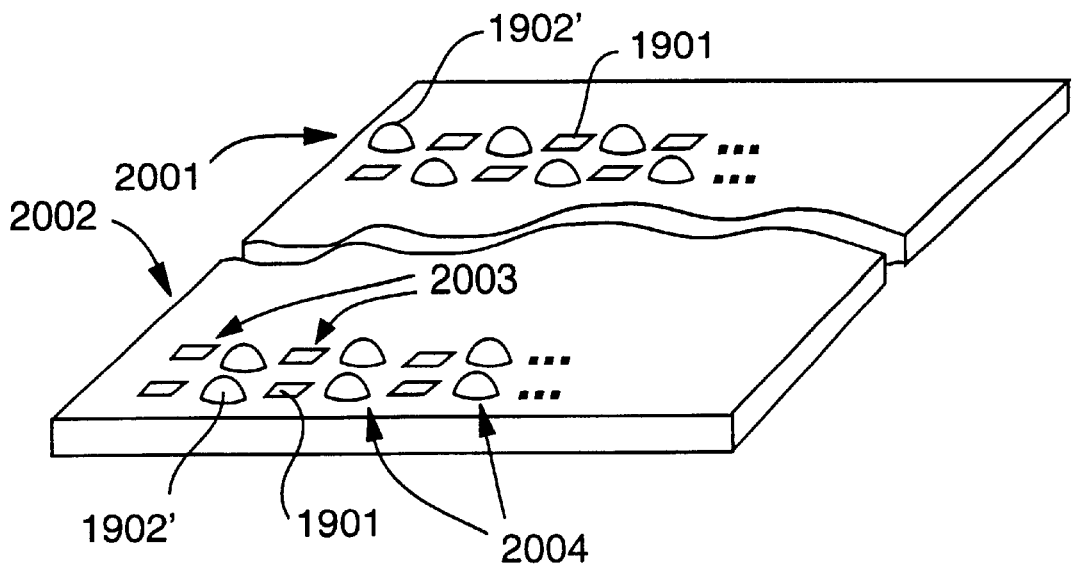
FIG. 20 shows two alternative perspective views of the arrangement of FIG. 19B.

FIG. 20 shows, very schematically, two possibilities for the array shown in FIG. 19B. The first possibility, indicated generally by the numeral 2001, has the lenses 1902' and the wire bonding pads 1901 alternately spaced across the array in both directions. In an alternative arrangement, shown generally by the numeral 2002, the lenses 1902' and the wire bonding pads 1901 alternate in one direction but not in the other. In this last arrangement, the wire bonding pads form individual rows 2003, while the microlenses form their own series of individual rows 2004.

It will be understood that the types of two dimensional array shown in FIG. 20 may be equally applicable for any of the arrays described, and in particular for the embodiments of FIGS. 5 to 8 and 21 to 23.

Figure 21:
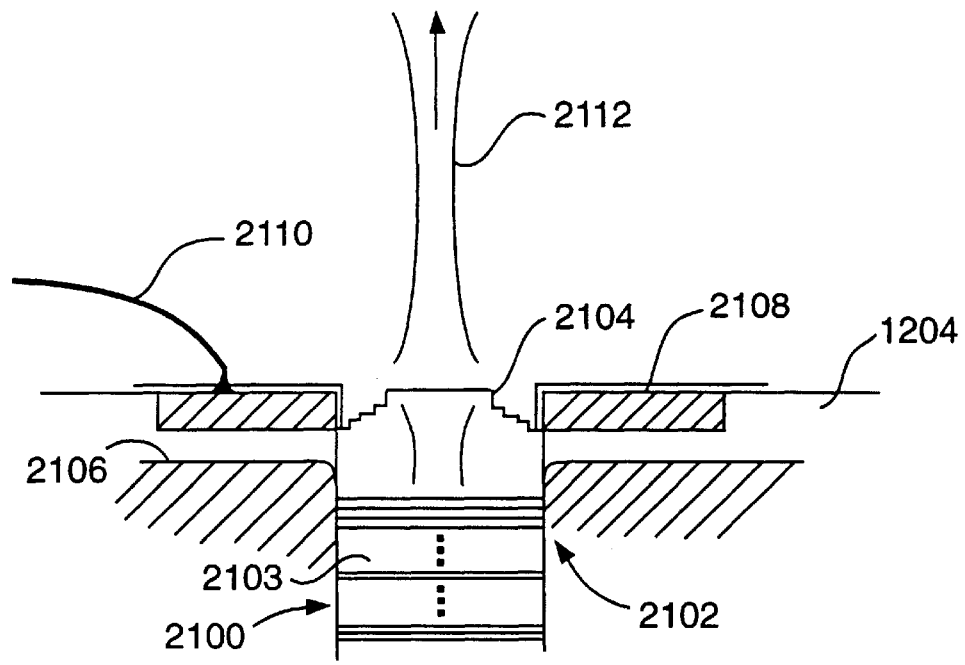
FIG. 21 is a schematic section through a VCSEL.

Yet another embodiment is shown in FIG. 21 which shows, in more detail, a section through a VCSEL and its associated wafer. The VCSEL 2100 includes a mirror stack 2102 and, in front of that, a patterned diffractive focusing lens 2104. The lasing (active) region is shown at 2103. The diffractive lens may be produced directly on the aperture of the VCSEL by electron beam writing or by other ion milling methods after the VCSELs are fabricated. Alternatively, a MOE may be provided. The same diffraction pattern may alternatively be generated by an extra masking step in the VCSEL fabrication process. The VCSEL itself is located within the wafer substrate 1204, the confinement region being indicated by the hashed area 2106. Adjacent the VCSEL aperture are wire bonding pads 2108 to which electrical connections 2110 may be bonded. In operation, lasing commences on receipt of a signal via the wire bond 2110, with the refractive lens 2104 creating a focused outgoing laser beam 2112.

Figure 22:
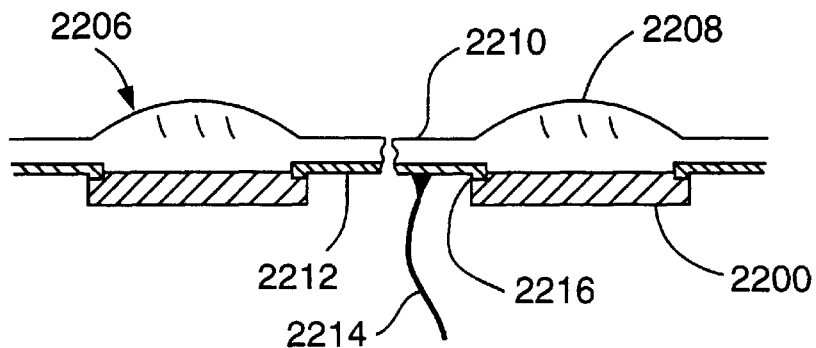
FIG. 22 is a more detailed section of the arrangement of FIG. 19B.
Figure 23:
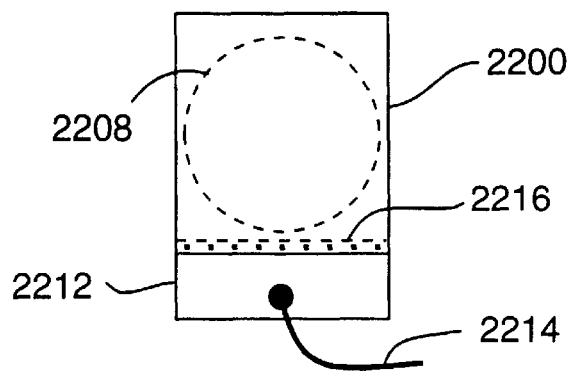
FIG. 23 is a schematic view from the rear of the arrangement of FIGS. 19B and 22.

FIGS. 22 and 23 show a further alternative arrangement. Here, a microlens wafer array or MOE 2206 consists of an array of individual lenses 2208 connected by a flat lens substrate 2210. The rear of the lens array is patterned with the desired electrical interconnections 2212, allowing for bonding of wire bonds 2214. VCSELs 2200 are positioned behind the lenses 2208, and are secured to the electrical interconnections 2212 by flip-chip bonding 2216. FIG. 23 shows the view from the rear, immediately behind one of the VCSELs 2200.

The manufacture of the embodiment of FIGS. 22 and 23 is quite straightforward. First, a VCSEL wafer is tested and defective devices are marked to be discarded later. The wafer is then diced into individual VCSELs or into small arrays of VCSELs. The microlens (optics) wafer 2206 is fabricated with the lenses 2208 being appropriately spaced to accommodate the VCSELs and the wire bonding pads. The lower surface of the wafer 2206 is then patterned with the desired electrical interconnections 2212. Next, the VCSELs 2200 are robotically picked and placed onto the lens wafer, in the appropriate position, and flip-chip bonded 2216. The optics wafer is then diced into individual pieces, and wire bonding 2214 or soldering to the pads on the optics wafer is then performed to provide electrical access to the VCSELs.

Figure 9:
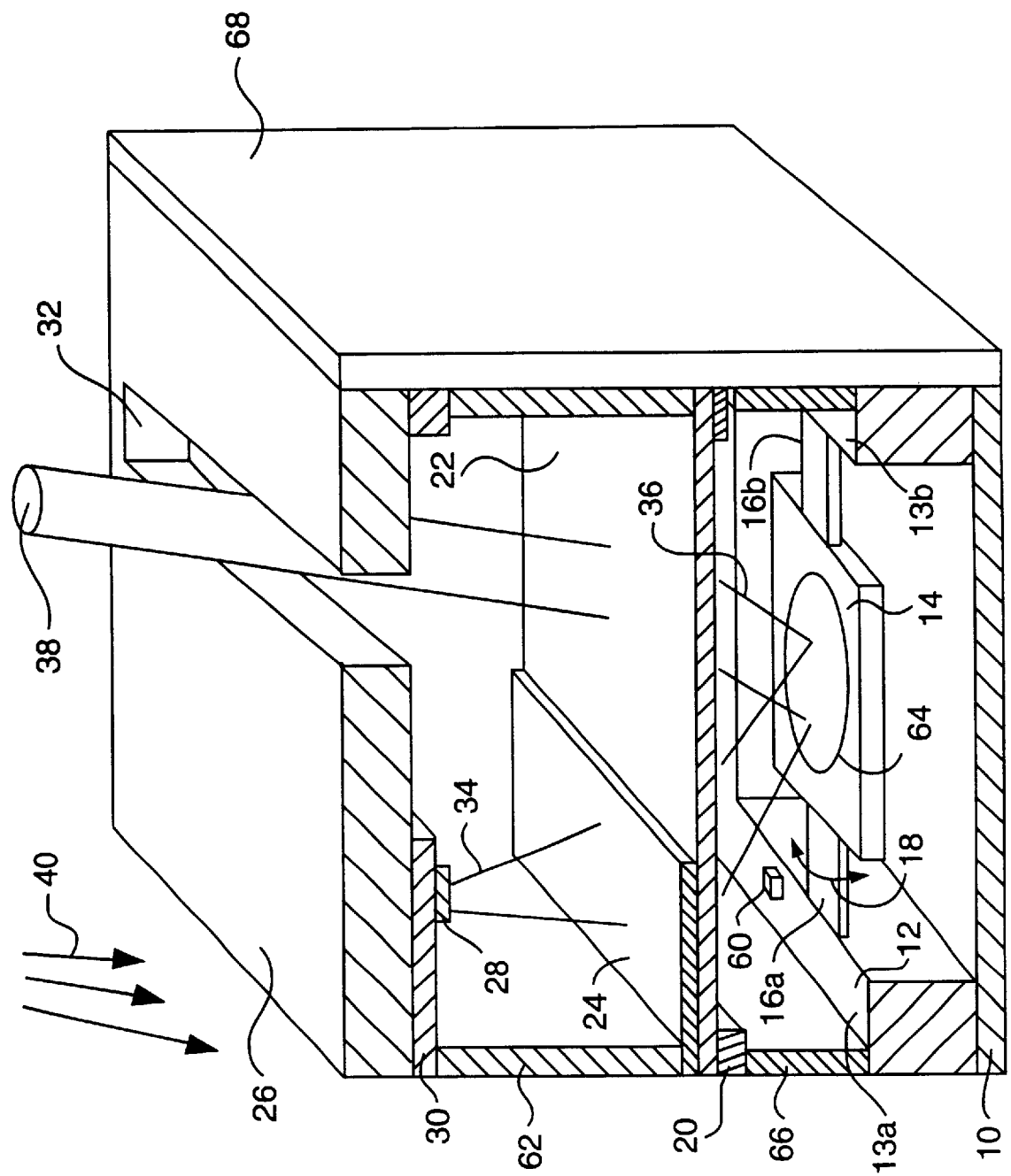
FIG. 9 is a cutaway perspective view of a miniature scan engine in accordance with another embodiment of the present invention.
Figure 10:
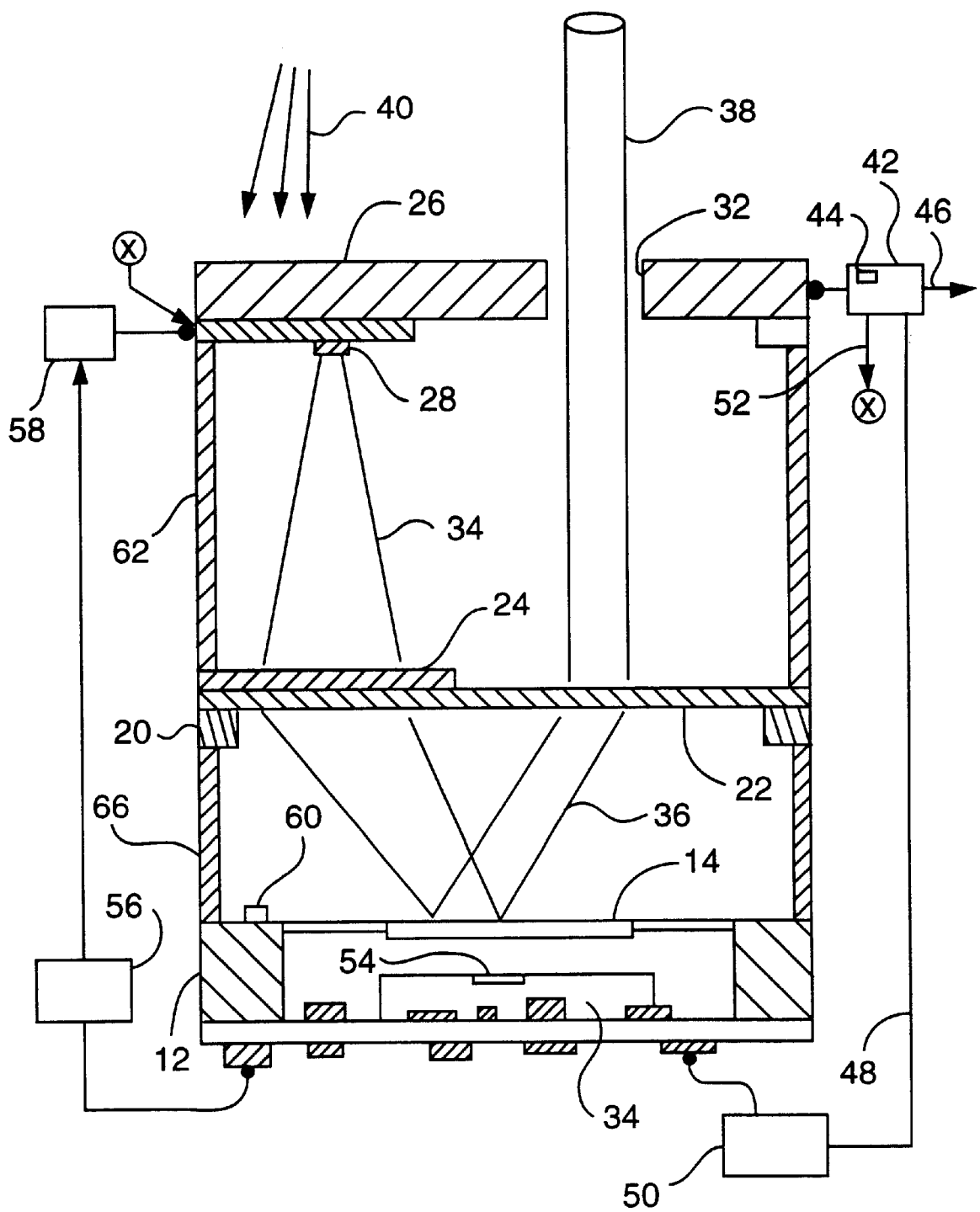
FIG. 10 is a longitudinal section through the miniature scan engine of FIG. 9, showing the electronics components in more detail.

FIGS. 9 and 10 show, also in highly simplified and schematic form, a scan engine/module in accordance with a further embodiment of the present invention. It is to be understood that the purpose of these Figures is merely to illustrate one possible arrangement of the features; further details of the individual features will be discussed below in connection with the other drawings.

The miniature scan engine shown in FIGS. 9 and 10 has a base or substrate 10 to which is bonded a generally rectangular mirror frame 12 for supporting a mirror 14. The mirror 14 size may typically be between 1 and 3 mm. The mirror is suspended between opposite edges 13a, 13b of the frame by TiNi (or silicon) hinges 16a, 16b. Because the hinges are slightly flexible in torsion, the mirror is free to make slight oscillations about the hinge axis, in the directions indicated by the arrows 18.

Supported on a subsidiary frame 20 above the mirror 14 is a micro-optical element (MOE) 24 or a glass substrate 22. Supported on an upper frame 30 is an upwardly-facing photodetector 26 and a downwardly-facing laser 28. The photodetector 26 is provided with a cut-out portion 32 in a direction perpendicular to the axis of the hinges 16a, 16b. Alternatively, there may be two separate detectors with a gap in between; or the beam may be deflected past one side of a single detector.

In operation, the laser 28 produces a light beam 34 which is conditioned and deflected towards the mirror 14. A mirror driver 34 (FIG. 10) causes the mirror rapidly to oscillate in the direction of the arrows 18, so producing a reflected scanning beam 36. This again passes through the MOE 24 (or the substrate 22) and out of the scan engine via the cut-out portion or slot 32. The resultant scanning beam 38 is directed to an indicia (not shown) to be read. Light 40 reflected from the indicia is detected by the photodetector 26, and a corresponding signal is sent to the digitizing and decoding electronics 42, these electronics including a microprocessor or CPU 44. The microprocessor provides an output signal on a line 46 representative of the characters or other information which are encoded by the indicia being read. A signal is also provided on a line 48 to mirror control electronics 50, the mirror control electronics controlling the mirror driver 34. A further signal on a line 52 allows the microprocessor to control operation of the laser 28.

Sensing electrodes 54 may detect the position of the mirror and provide a feedback signal to associated electronics 56. These may provide feedback control signals to laser control electronics 58. It will be understood, of course, that the electronics may be positioned anywhere convenient on the module, and not just in the positions shown.

We now turn to a more detailed description of the various components illustrated in FIGS. 9 and 10. The laser 28 will normally be a laser diode, and is preferably a vertical cavity surface emitting laser diode (VCSEL). The packaging advantage of using a VCSEL instead of a more conventional edge-emitting visible laser diode (VLD) is that VCSELs can naturally be placed on a flat surface emitting the beam from their opposite surface as shown in the drawings.

There are various possibilities for providing accurate laser power control, in addition to or instead of the feedback loop 56,58 shown in FIG. 10. Alternatively, the MOE 24 may incorporate a beam splitter to direct a small proportion of the output beam towards a detector 60 on the mirror frame 12. Finally, another laser on the VCSEL chip (covered by a detector) could be used to monitor the change in power output of the VCSEL with temperature, and used to adjust the drive current. The VCSEL can in principle be designed to be self-compensating of temperature change.

The VCSEL chip may contain several independently operable lasers. Each laser may have active areas of a different size so that a single focusing lens such as the MOE 24 can provide beams with different working ranges. Alternatively, a miniature lenslet array can be placed on top of the VCSEL chip, changing the divergence of each laser slightly so that a common focusing lens 22 can generate beams with different working lenses. The lasers may be operated sequentially, thereby obtaining dynamic focusing.

The VCSEL chip may be secured to the upper frame 30, as shown in the drawings, or alternatively it could be secured directly to the underside of the photodiode 26. Provided that the spacing within the scan engine can be well defined, and the MOE 24 suitably chosen, there may be no need to dynamically focus the laser. To that end, a spacer 62 positioned between the laser and the lens 24 may locate the laser to an accuracy of better than 20 micrometers, thereby achieving repeatable and accurate focusing without the need for adjustment. Another spacer 66 defines the spacing between the MOE and the mirror. The laser beam 34 is deflected and focused towards the mirror 14. In an alternative embodiment (not shown) one or both of these may be replaced by a conventional lens. In addition, in other embodiments it may or may not be useful for the scanning beam 36 from the mirror to pass back through the MOE 24. Alternatively, or in addition a diffractive optical element may be etched onto the mirror surface, or separately attached to the mirror surface, thereby eliminating the need for the MOE 24, and the support 22. A yet further possibility is to mount a separate refractive lens or MOE 64 onto the mirror surface. By mounting the focusing lens 64 directly onto the scanning surface, it is ensured that the light has to travel through the lens twice; accordingly, the focusing effect of the lens is effectively doubled, so reducing the power of the lens that is needed. A negative lens will increase the scan angle, if desired. Additional optics may be provided, as necessary, to correct the geometrical "smiley" effect. Another grating or MOE could also be provided to straighten out the deflection effect.

If it is thought desirable to shape the beam profile, additional apertures (not shown) may be provided. Where an elliptical beam is required, either the VCSEL aperture may be made elliptical, or the MOE could instead be used to obtain the appropriate shape. Alternatively, an aperture (not shown) could be used to shape the outgoing beam. Two lasers may be located one above the other on the same chip to provide an elliptical beam; this approach can also increase the laser power.

The cutout portion or slot 32 through which the outgoing beam 38 leaves the scan engine may be etched out from the photodiode 26. Alternatively, two photodiodes may be used leaving the necessary aperture between them for the beam to leave the module; or there could be one photodiode placed to one side of the beam.

While the photodiode 26 is shown as part of the scan engine in FIGS. 9 and 10, this is not essential and the photodiode can, if desired, be housed independently in a separate receiver front end. The receiver front end (not shown) consists of the photodiode, an optical filter, an optical apparatus to limit the field of view of the receiver, and the necessary electronics. The optical filter may be coated directly onto the photodiode surface. The field of view of the detector needs to be limited in order to reduce the ambient light reaching the photodiode, and this may be achieved in several ways. Firstly, a focusing lens may be placed in front of the receiver, which collects the scattered light over a well defined solid angle. Baffles around the photodiode may also be used to limit the detector's field of view. Alternatively, a miniature louver filter may be employed to limit the numerical aperture of the receiver. The use of a louver filter greatly reduces the size of the device, since it may be thinner than 1 mm, and may be directly mounted onto to the diode-filter assembly. The receiver electronics may be placed on the rear side of the photodiode, or may be placed in an electronics package 68 (FIG. 1) on the side of the scan engine.

Figure 11:
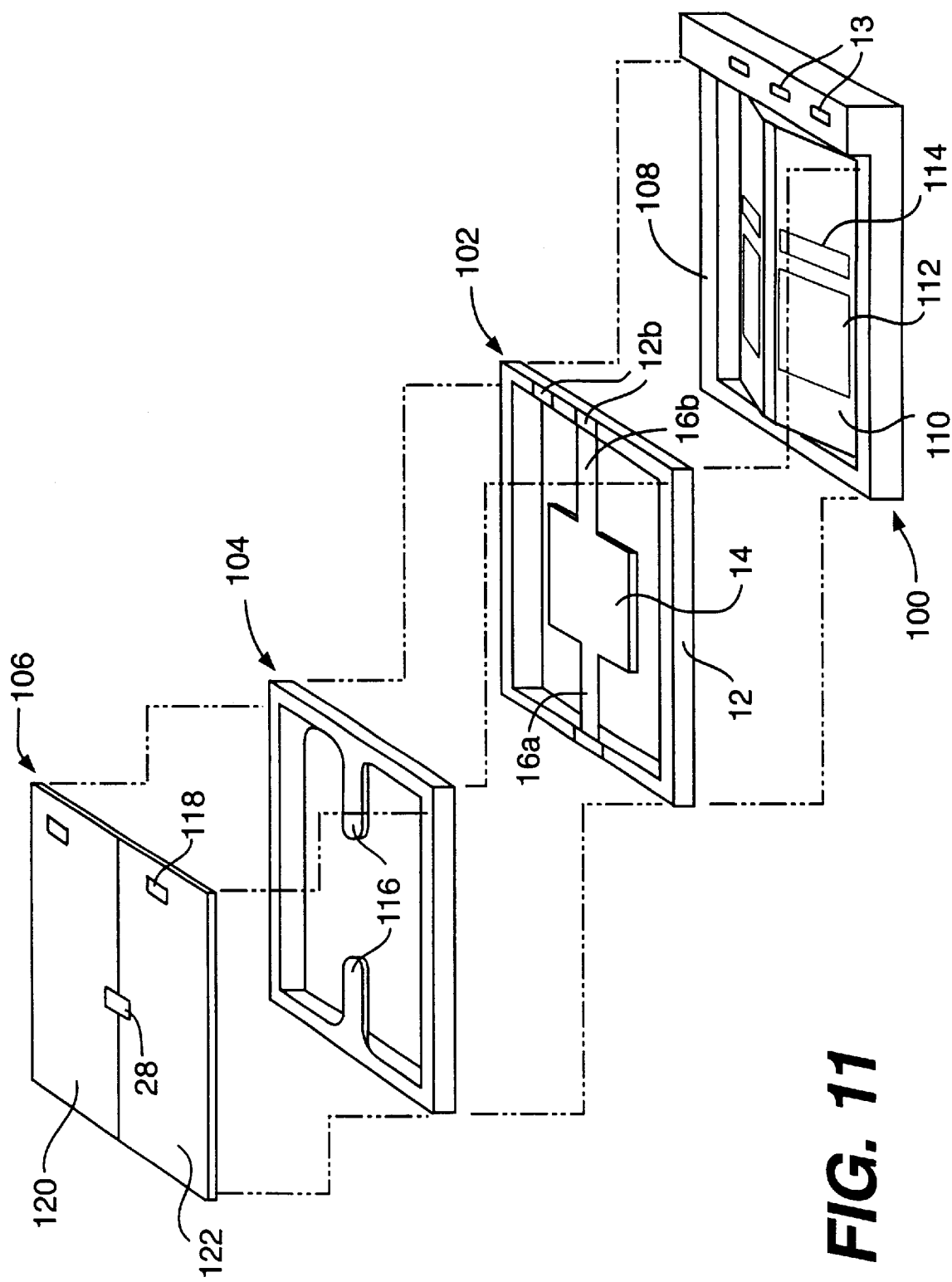
FIG. 11 illustrates the layered construction of the scan engine in one preferred form.

It will be recalled that FIGS. 9 and 10 are purely schematic. FIGS. 11 to 13 show in more detail how a practical embodiment of the invention may be constructed in its preferred form. As FIG. 11 shows, the scan engine package is preferably built up as a sandwich using wafer technology. The package includes, in order, a wafer substrate 100, a wafer mirror frame 102, and a wafer cover 104. The wafer cover 104 may include or may have attached to it a transparent cover sheet 106.

The wafer substrate 100 includes a substrate frame 108 within which there is a roof-like stop member 110, the purpose of which is to prevent excess movement of the mirror, for example when the package is dropped. The stop member also includes control electrodes 112 and position detecting electrodes 114 for controlling and detecting movement of the mirror. The electrodes are preferably through-wafer coated electrodes, but could instead be pins inserted into the wafer. Alternatively, the electrodes may be printed on the upper surface of the stop member 110, with appropriate electrical connections (not shown) to the control electronics. In the recess (not shown) beneath the stop member there may be contained the necessary control electronics and/or printed circuit boards.

Bonded to the upper surface of the frame 108 is the frame 12 of the wafer mirror frame 102. This carries the mirror 14 on hinges 16a,16b as previously discussed. Bonded to the frame 102 is the wafer cover 104 which includes cantilevered spring-board like mirror stops 116. These stops extend inwardly from opposing edges of the wafer cover and are positioned immediately above the hinges 16a,16b so as to extend out over parts of the mirror. It should be noted that these stops are not shown in FIGS. 9 and 10. If the device is dropped, the stops 116 along with the stop member 110 prevent breakage by limiting mirror travel and the amount of stretching of the hinges 16a,16b.

Above the wafer cover 104 is the transparent cover sheet, to which is mounted the VCSEL 28. The electrical connections to the VCSEL are provided by wire bonds to miniature pads (not shown) on the cover sheet, immediately beneath the VCSEL. These in turn are connected to pads 118 at the edge of the cover sheet by transparent conductors 120, 122. It will be appreciated, of course, that the scanning beam 38 (FIG. 9) passes out through the transparent cover sheet and will accordingly be partially intercepted by the VCSEL chip 28. However, in view of the chip's very small size (approximately 50 micrometers square) it will have minimal practical effect on the beam quality. Indeed, the very slight discontinuity in the beam may be detected within the incoming reflected light 40, and may be used to provide a feedback signal which tracks the beam movement.

The transparent electrodes may in some embodiments be used instead of or together with the electrodes 112 for driving the mirror. Alternatively, they may be used instead of the electrodes 114 for sensing mirror position.

In an alternative embodiment (not shown) the VCSEL may be placed off-center on the cover sheet 106, thereby reducing its effect on the outgoing beam. However, if the chip were to form a large incident angle with the outgoing beam it would tend to cause a "smiling" effect in the beam, which is undesirable.

In operation, power and/control signals are transmitted through the sandwich by means of appropriate throughwafer electrodes shown schematically at 124 and 126.

Figure 12A:
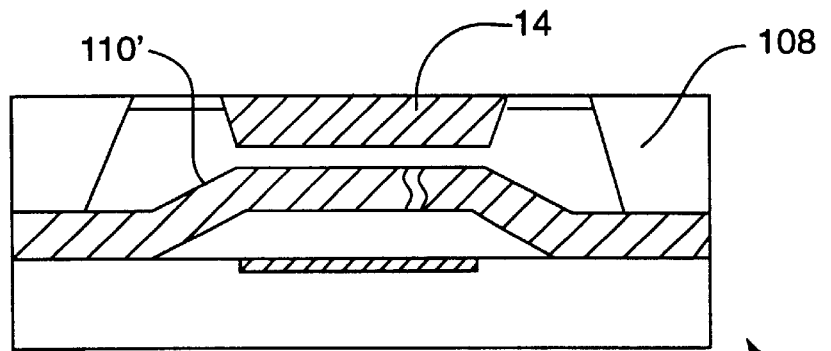
FIGS. 12A and 12B show alternative mirror stop arrangements.
Figure 12B:
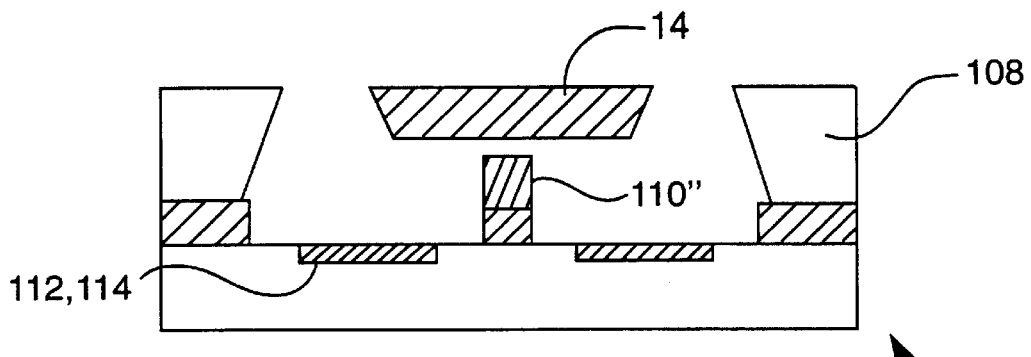

FIGS. 12A and 12B show two preferred alternatives for the configuration of the wafer substrate 100. The arrangement in FIG. 12A corresponds generally although not precisely to that shown in FIG. 11, in that it incorporates a roofed stop member 110' for limiting the extent of travel of the mirror 14. Electrodes are positioned on the slanted floor. In the alternative arrangement of FIG. 12B, the stop is replaced merely by an upstanding rib 110", with the electrodes 112,114 being coated onto the flat surface of the substrate on either side of the rib. While the embodiment of FIG. 12A is somewhat more efficient in use, the embodiment of FIG. 12B is cheaper to manufacture.

The sandwich structure best illustrated in FIG. 11 may be put together individually for each new scan engine being manufactured. However, this is a rather costly process and FIG. 13 illustrates an alternative approach in which three large scale wafer arrays are first fabricated, then bonded together, and finally diced or cut up into a plurality of individual packages. In FIG. 13, the upper wafer 1104 represents a repeating array of wafer covers 104, the middle wafer 1102 a repeating array of mirror frame wafers 102 and the lower wafer 1100 a repeating array of wafer substrates 100. Prior to bonding and dicing, the wafers are aligned by means of pins (not shown) which pass through respective alignment holes 128 in each of the wafer arrays. Alternatively, infra-red alignment marks may be incorporated on the wafers, in which case the pins may be eliminated.

The wafer arrays may be fabricated by a variety of techniques, such as silicon micromachining, injection molding, stamping, casting, extruding, electrostatic discharge or computer numerical controlled machining, etchform-and-coining, and so on. The bonding may be realised using a variety of techniques including precut or preformed adhesive films, liquid adhesives, solder bumping, thermal or anodic bonding, or any other technique commonly used in the industry.

For the lower stop wafer array 1100, which could also become in the preferred embodiment the wafer substrate, micromachining, micro-injection molding, and a combination of etching and metal forming are the preferred technologies, although stamping is another possibility. The substrate is preferably of an appropriate resin material, such as polyetherimide, polycarbonate, polyester or styrene based resins. In order to prevent the accumulation of static charges on the plastics, impregnated electrically conductive particles may be used. The electrodes on the lower array 1100 may be coated or printed. Electrical access to the electrodes may be provided by through-wafer vias, with the electrode patterns imaged on both sides of the substrates. Alternatively, rectangular pins may be inserted through-wafer during or after the plastic molding process. These pins become the electrodes themselves. If the electrodes are printed only on one side of the wafer, then wire bonds may be routed through to exposed frame areas where external electrical contacts can be provided. The mirror stops on the wafer substrate may be provided by an etched BeCu plate, the raised mirror stop portions being created by coining. This plate then can be laminated onto a PC board with actuation and pick-up electrodes. Alternatively, the plate may be laminated with an etched Kapton spacer disk. The electrodes need not be on the bottom stop; they may instead or in addition be on a separate substrate where the mirror stop assembly is mounted.

The central wafer array 1102 is preferably of silicon with TiNi hinges 16a,16b.

The top wafer array 1104 is preferably of a plastics material, and may be formed in the same way as the bottom wafer array 1100.

In addition to the upper array 1104, a transparent top sheet (not shown) may be provided which will eventually form the transparent cover sheets 106 (FIG. 11). A transparent top sheet not only protects the mirror from foreign objects in use, it also provides protection from debris and molten resin or silicon during wafer dicing. As already discussed in conjunction with FIG. 11, transparent electrodes may be deposited on this cover sheet.

Figure 14:
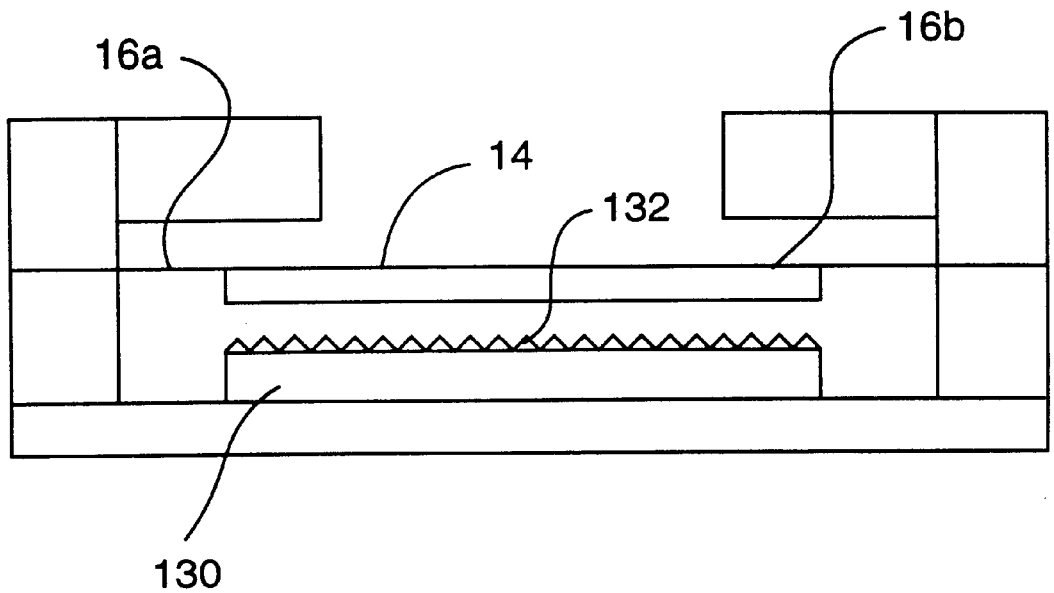
FIG. 14 shows details of an alternative embodiment having a travel stop with teeth to prevent unwanted movement of the mirror.

Turning now to FIG. 14 there is shown an alternative stop arrangement that may be used in substitution for the stops 110,110',110" of FIGS. 11 and 12. In this variation, a stop member 130 is formed with a plurality of teeth 132. If the scan engine is dropped, the hinges 16a,16b are likely to stretch until the mirror 14 hits the stop 130. This in itself may be enough to prevent the hinges being damaged, but if the mirror hits the stop at an oblique angle it may continue to slip and slide across the stop until the hinges become damaged. In this variant, the teeth 132 prevent this slippage from occurring.

The teeth 132 could in some configurations be replaced by elongate ridges or indentations in the stop, and they may be provided on all of the stops or only on some of them, as required. The stops with teeth, ridges or indentations may be realised by micro-machining, etching, machining, grinding, molding, stamping, sanding, plating, electro-forming or any other appropriate process. The mirror stops could also, in an alternative embodiment, be integral with the mirror itself or with the moving mirror assembly.

It will be understood that the mirror 14 may be oscillated using any appropriate type of driver 34 (FIG. 10). Suitable drivers include electromagnetic and electrostatic drivers, along with drivers which use the shape memory properties of the TiNi hinges 16a,16b. This last approach will now be described in more detail with reference to FIG. 15.

Figure 15:
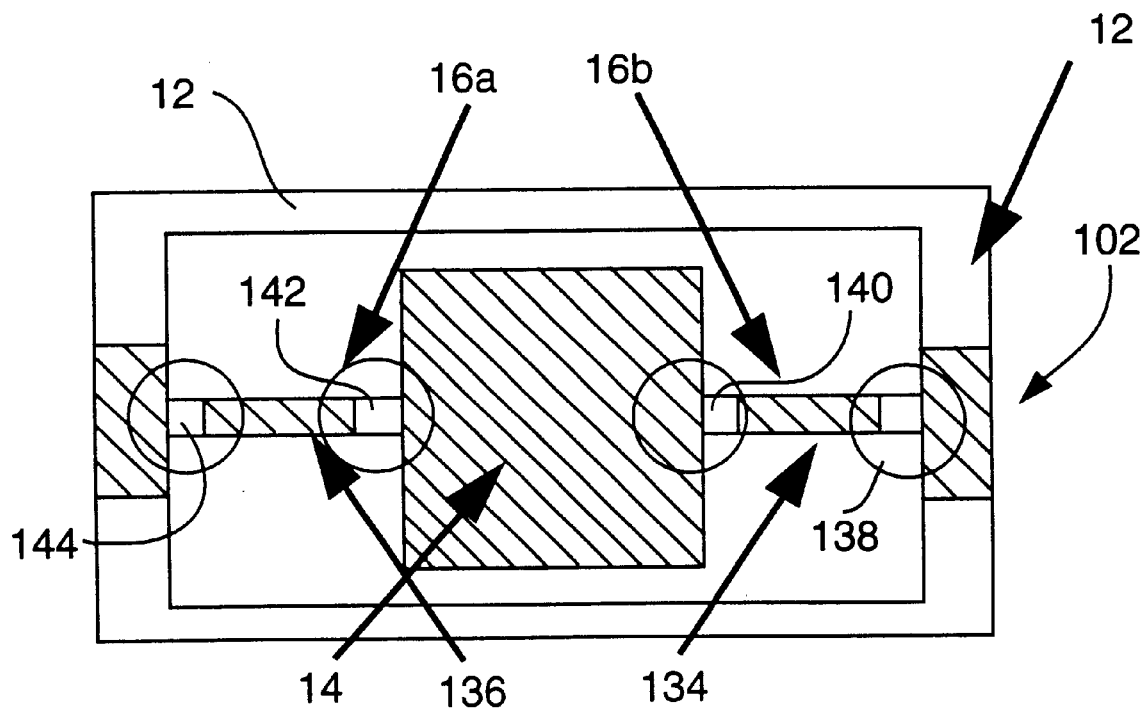
FIG. 15 shows a further embodiment for reducing the current required for shape memory actuated scan engines.

FIG. 15 is a top view of the mirror frame wafer 102 showing the mirror 14 suspended on the frame 12 by means of TiNi hinges 16a,16b. The shape memory effect relies on the fact that shape memory alloys such as TiNi return to their high temperature (austenite) shape when heated above a critical temperature, usually 60° to 70° centigrade; this can be changed by altering the stoichiometry of the Ti and Ni composition. In order to obtain two-way shape memory, which is necessary for the mirror 14 to oscillate between two different positions, the shape memory alloy needs to be "trained" to have a cold (martensite) shape as well.

The mirror is actuated by applying a sine wave, square wave or other periodic signal through the hinges. The hinges become resistively heated when the current is on, and lose heat when the current is off. When the square wave is applied at the device's resonant frequency, the mirror oscillates back and forth about its torsional axis as the hinges are changing shape between their austenite and martensite states.

It is believed that most of the shape change occurs at the ends of the hinges, where they meet the frame and the mirror, and where large stress concentrations build up. However, the hinges become heated uniformly along their length which is inefficient since most of the heat generated in the central portion of each hinge is not instrumental in the shape change. Accordingly, to improve efficiency, each hinge has its central portion 134,136 coated with a thin layer of an electrically conductive material. This avoids heating that portion of the hinge, and concentrates heating at the hinge ends where most of the shape change is taking place. In FIG. 15, the end portions of the hinges 138–144, which are left uncoated, are shown in grey. The hinges may be rounded at the corners to reduce stress concentration and improve life.

Even where electrostatic actuation of the mirror is preferred, the shape memory property of the TiNi hinges may also be used. When the device is dropped, the TiNi hinges may stretch (strain) by about 3% to 4%, but their original shape can be recovered by passing through the hinges a short pulse of electric current. This heats up the hinges, and as they return to their austenite state, they reshape themselves back to their original form. The current pulse may, in the preferred embodiment, last for about 50 milliseconds and be of around 100 mA.

It is not essential for the mirror to be suspended between torsional hinges, as previously described. Other modes of mounting the mirror for oscillation may be equally useful, and all are intended to be encompassed within the scope of the present invention. One preferred alternative mirror mounting arrangement is shown in FIG. 16.

Figure 16:
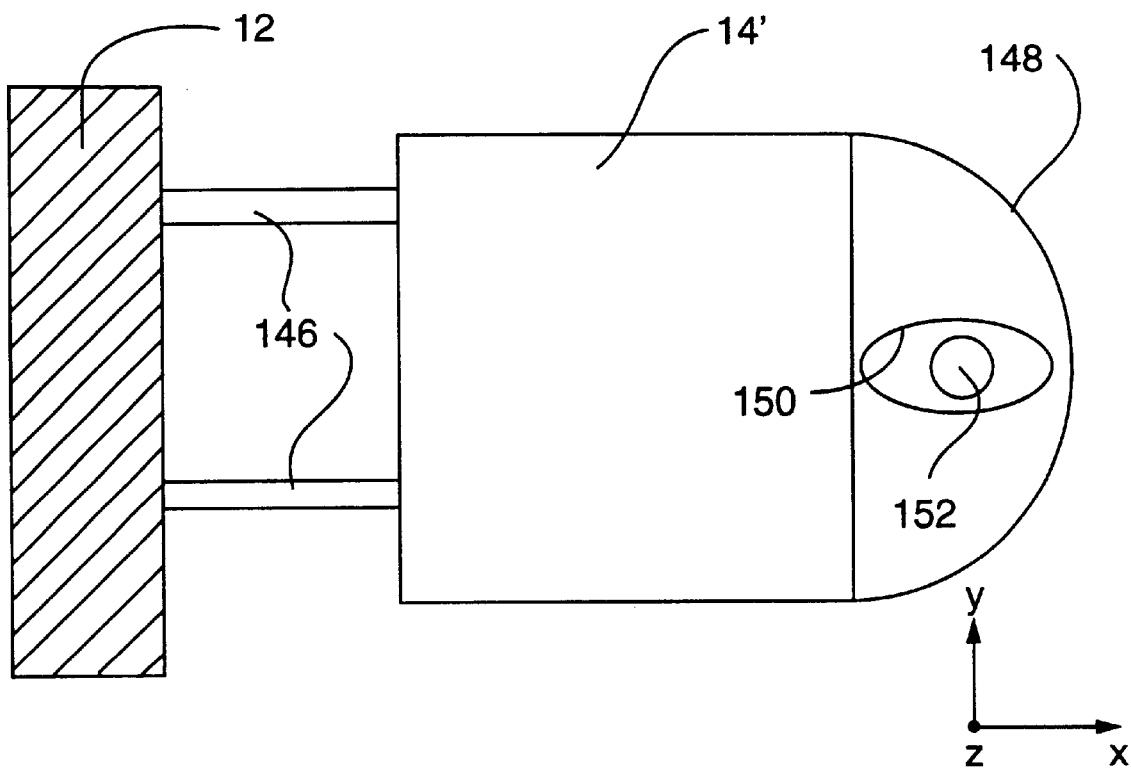
FIG. 16 shows an alternative method of mounting the mirror.
Figure 16:
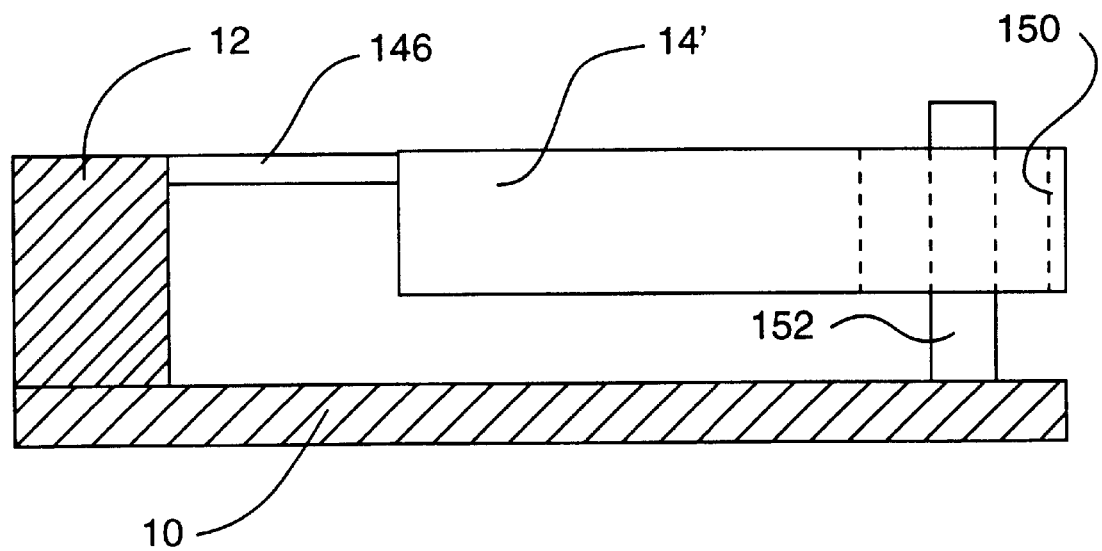

In the cantilever-type arrangement of FIG. 16, the mirror 14' is mounted for oscillation on the frame 12 by two cantilever beams 146. The mirror is formed with an extension 148 within which is etched or otherwise formed an elliptical hole 150. A pin 152 is received within the hole and served to limit mirror travel, in the event that the device is dropped, both in the x and y directions. It also limits twisting movement of the mirror about the x axis. Finally, the pin also serves as an over-travel stop in the up and down (z) direction, the desired motion of the mirror as the beams 146 flex slightly in normal operation.

The pin 152 is desirably fabricated by the LIGA micromachine process. This process is very well known to those familiar with micromachining technology, and will accordingly not be described here. The mirror may be oscillated by any convenient means, including electromagnetically, electrostatically, bimetallically, or by means of the shape memory process. The mirror 14" (and indeed the mirror 14 shown in FIG. 9) is desirably rectangular, but could also be square, circular or elliptical. Laser speckle may be reduced by the use of several lasers.

Figure 17:
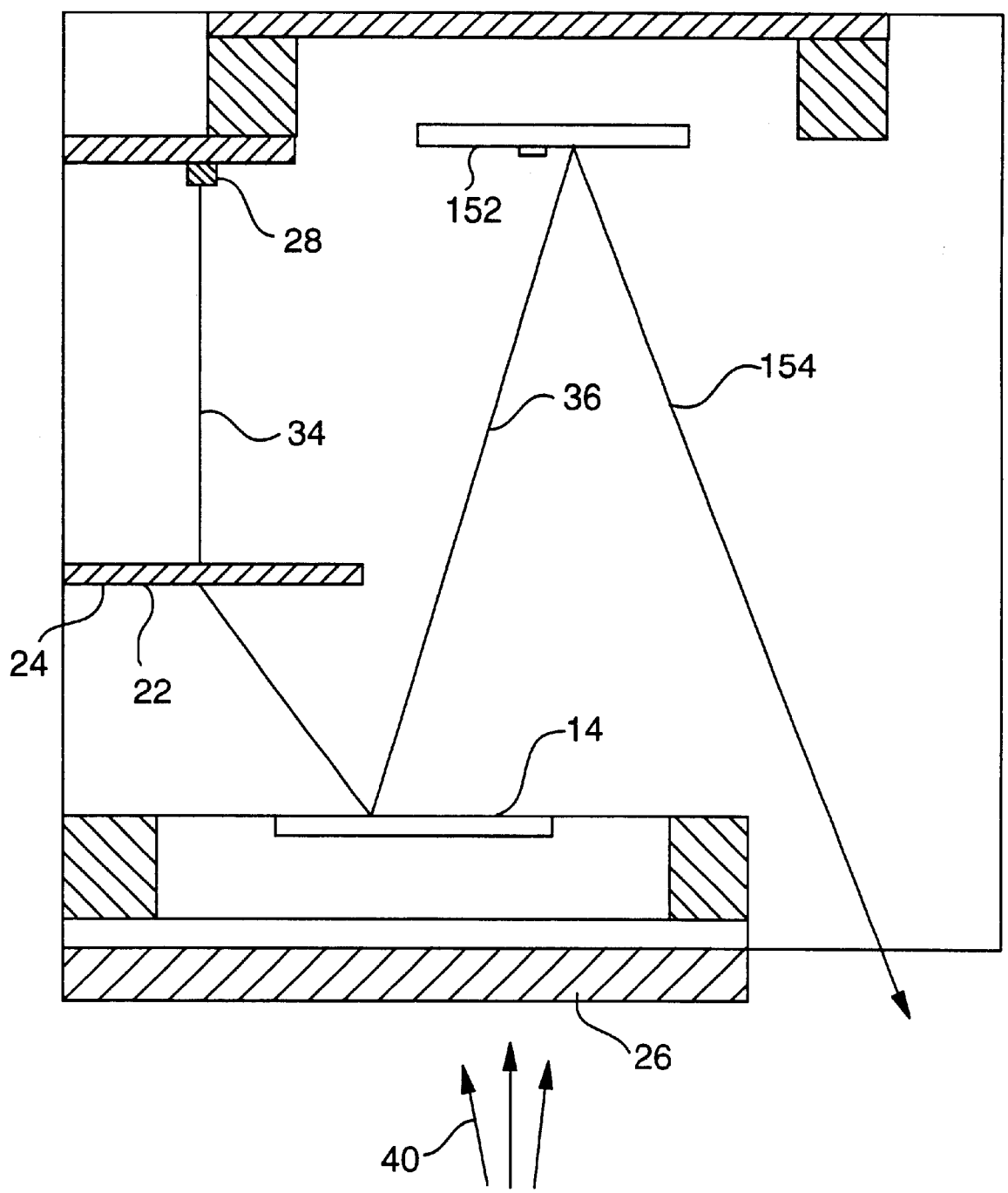
FIG. 17 shows yet another embodiment for two-dimensional scanning.

The present invention relates not only to one-dimensional but also to two-dimensional scanners, and there is shown in FIG. 17 a schematic sectional representation of such a scanner.

In the embodiment of FIG. 17, the reflected beam 36 from the mirror 14 is incident upon a second mirror 152 which is scanning in a direction orthogonal to that of the mirror 14. Accordingly, the outgoing beam 154 scans in two separate directions. The mirrors 14,152 have different resonant frequencies, and the frequency of the second mirror 152 may be greater or less than the frequency of the other mirror 14.

It will be noted in the FIG. 17 embodiment that the reflected beam 36 entirely misses the MOE 22. In an alternative arrangement (not shown) either or both of the beams 36,154 could be shaped and/or deflected by the MOE 22 or another MOE (not shown).

Figure 18:
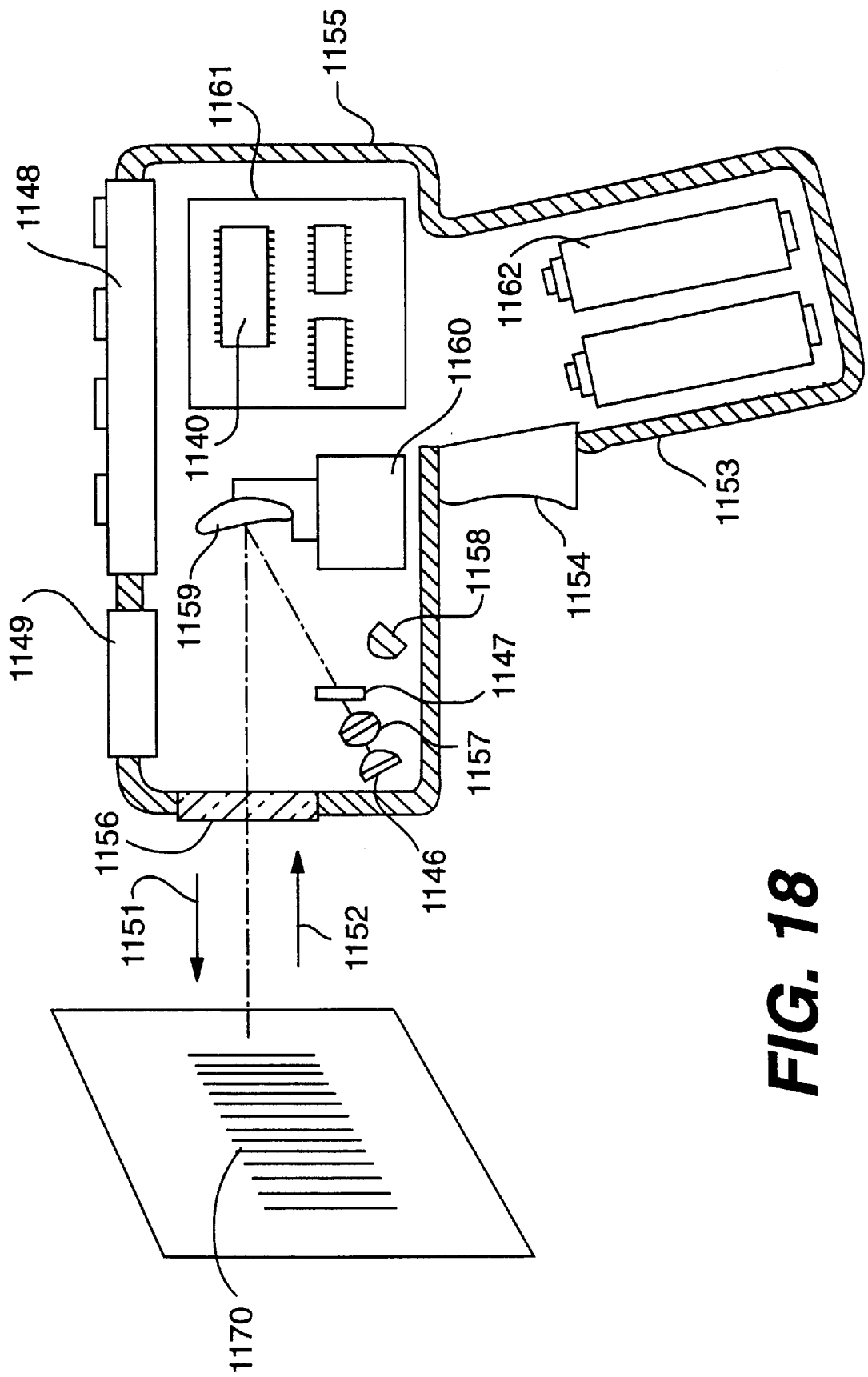
FIG. 18 illustrates a hand held bar code reader suitable for incorporating any one of the described embodiments of the present invention.

The scan engine of the present invention may be incorporated into any desired portable or fixed scanning system, such as a bar code scanner. FIG. 18 illustrates a highly simplified embodiment of one type of bar code reader that may utilise any of the scan engines described. In one hand-held embodiment, shown in FIG. 18, a housing 1155 includes an exit port 1156 through which an outgoing laser light beam 1151 is directed to impinge upon, and to be scanned across, symbols 1170 located exteriorly of the housing The device may also find application in pen-scanners, mice, telephone scanners, PC-cards and so on.

The hand-held device of FIG. 18 is generally of the style disclosed in U.S. Pat. No. 4,760,248 issued by Swartz et al., or in U.S. Pat. No. 4,896,026 assigned to Symbol Technologies, Inc. and also similar to the configuration of a bar code reader commercially available as part number LS 8100, LS 2000 or LS 3000 from Symbol Technologies, Inc. Alternatively, or in addition, features of U.S. Pat. No. 4,387,297 issued to Swartz et al. or U.S. Pat. No. 4,409,470 issued to Shepard et al., both patents assigned to Symbol Technologies, Inc., may be employed in constructing the bar code reader unit of FIG. 18. These U.S. Pat. Nos. 4,760,248, 4,896,026, and 4,409,470 are incorporated herein by reference, but the general design of such devices will briefly be described here for reference.

Referring to FIG. 18 in more detail, an outgoing light beam 1151 is generated in the reader, usually by an electro-optic device of the present invention, and directed to impinge upon a bar code symbol disposed on a target a few centimetres or inches from the front of the reader unit. The outgoing beam 1151 is scanned in a scan pattern, and the user positions the hand-held unit so this scan pattern traverses the symbol to be read. Reflected and/or scattered light 1152 from the symbol is detected by a light-responsive device 1158 in the reader unit, producing serial electrical signals to be processed and decoded for reproducing the data represented by the bar code. As used hereinafter, the term "reflected light" means reflected and/or scattered light.

In a preferred embodiment, the reader unit is a gun shaped device having a pistol-grip type of handle 1153. A movable trigger 1154 is employed to allow the user to activate the light beam 1151 and detector circuitry when the user has positioned the device to point at the symbol to be read. A lightweight plastic housing 1155 contains the laser light source 1146, the detector 1138, the optics 1157, 1147, 1159, and signal processing circuitry including a CPU 1140 as well as power source of battery 1162. A light-transmissive window 1156 in the front end of the housing 1155 allows the outgoing light beam 1151 to exit and the incoming reflected light 1152 to enter. The reader is designed to be aimed at a bar code symbol spaced from the symbol, i.e., not touching the symbol or moving across the symbol.

The reader may also function as a portable computer terminal, and include a keyboard 1148 and a display 1149, such as described in the previously noted U.S. Pat. No. 4,409,470.

Although the present invention has been described with respect to reading one or two dimensional bar codes and other indicia, it is not limited to such embodiments, but may also be applicable to more complex indicia scanning applications. It is conceivable that the present invention may also find application for use with various machine vision or optical character recognition applications in which information is derived from other types of indicia such as characters or from the surface characteristics of the article being scanned. It may also find application in pen scanners, telephone scanners, PC-cards and so on.

In all of the various embodiments, the elements of the scan engine may be assembled into a very compact package that allows the entire scanner to be fabricated as a micromodule, possibly including a MOE. Such a module can interchangeably be used as the laser scanning element for a variety of different types of data acquisition systems. For example, the module may be alternately used in a hand-held scanner, a table top scanner attached to a flexible arm or mounting extending over the surface of the table or attached to the underside of the table top, or mounted as a subcomponent or subassembly of a more sophisticated data acquisition system. Control or data lines associated With such components may be connected to an electrical connector mounted on the edge or external surface of the module to enable the module to be electrically connected to a mating connector associated with other elements of data acquisition system.

An individual module may have specific scanning or decoding characteristics associated with it, e.g. operability at a certain working distance, or operability with a specific symbology or printing density. The characteristics may also be defined through the manual setting of control switches associated with the module. The user may also adapt the data acquisition system to scan different types of articles or the system may be adapted for different applications by interchanging modules on the data acquisition system through the use of the simple electrical connector.

The scanning module described above may also be implemented within a self-contained data acquisition system including one or more such components as keyboard, display, printer, data storage, application software, and data bases. Such a system may also include a communications interface to permit the data acquisition system to communicate with other components of a local area network or with the telephone exchange network, either through a modem or an ISDN interface, or by lower power radio broadcast from the portable terminal to a stationary receiver.

It will be understood that each of the features described above, or two or more together, may find a useful application in other types of scanners and bar code readers differing from the types described above. It is specifically contemplated by the applicants that any one or more of the features described or referred to above may form part of the present invention. It is further contemplated that any two or more compatible features, taken together, may also form part of the present invention. Accordingly, it should be understood that, where applicable, features referred to and described in connection with one figure may be used in association with features described in connection with another figure. For example (but without limitation) the micro-optics arrays shown in FIGS. 5 to 8 could be used either with any of the embodiments of FIGS. 1 to 3 or alternatively in conjunction with any of the embodiments of FIGS. 9 to 17. Likewise, it will be understood that the mirror mounting arrangements shown in FIGS. 15 or 16 could be used with any of the embodiments described, including FIGS. 1 to 4, and not only those embodiments which specifically show the mirror being mounted in that particular way.

While the invention has been illustrated and described with reference to various embodiments, it is not intended to be limited to the details shown, since various modifications and structural changes may be made without departing in any way from the spirit of the present invention.

Without further analysis, the foregoing will so fully reveal the gist of the present invention that others can readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed is:

1. A mirror subassembly, comprising:
   a base;
   electrodes mounted on said base for supplying electrical energy to said mirror subassembly;
   a support mounted on said base;
   a mirror mounted on said support, said mirror oscillating in response to the electrical energy supplied by said electrodes;
   an overlay mounted on said support opposite said base, said overlay including a mirror stop to limit movement of the mirror when the mirror subassembly is subjected to a mechanical shock, said mirror stop being spaced apart from said electrodes; and
   a transparent cover mounted on said overlay opposite said support.

2. The mirror subassembly according to claim 1, wherein said base includes a mirror stop to limit movement of the mirror.

3. The mirror subassembly according to claim 1, where said base and said support together define a recess, said mirror being suspended across and contained within said recess.

4. The mirror subassembly according to claim 1, wherein at least part of said base comprises a resin.

5. The mirror subassembly according to claim 1, wherein said mirror is suspended by hinges.

6. The mirror subassembly according to claim 5, wherein said mirror stop comprises cantilevered protrusions extending inwardly from edges of said overlay, said protrusions being positioned immediately above each of said hinges.

7. The mirror subassembly according to claim 1, wherein said mirror stop comprises cantilevered protrusions extending inwardly from edges of said overlay.

8. The mirror subassembly according to claim 1, wherein at least part of said support comprises silicon.

9. The mirror subassembly according to claim 1, wherein at least part of said overlay comprises a plastic material.

10. A mirror subassembly, comprising:
a base;
electrodes mounted on said base for supplying electrical energy to said mirror subassembly;
a support mounted on said base;
a mirror mounted on said support, said mirror oscillating in response to the electrical energy supplied by said electrodes;
an overlay mounted on said support opposite the base, at least one of said base and said overlay including a mirror stop to limit movement of the mirror, said mirror stop having a roughened surface; and
a transparent cover mounted on said overlay opposite said support.

11. A mirror subassembly, comprising:
a base;
electrodes mounted on said base for supplying electrical energy to said mirror subassembly;
a support mounted on said base;
a mirror mounted on said support, said mirror oscillating in response to the electrical energy supplied by said electrodes;
an overlay mounted on said support opposite said base, said overlay including a mirror stop to limit movement of the mirror, said mirror stop comprising cantilevered protrusions extending inwardly from edges of said overlay; and
a transparent cover mounted on said overlay opposite said support.

12. The mirror subassembly according to claim 11, wherein said base includes a mirror stop to limit movement of the mirror.

13. The mirror subassembly according to claim 11, wherein said base and said support together define a recess, said mirror being suspended across and contained within said recess.

14. The mirror subassembly according to claim 11, wherein at least part of said base comprises a resin.

15. The mirror subassembly according to claim 11, wherein said mirror is suspended by hinges.

16. The mirror subassembly according to claim 15, wherein said cantilevered protrusions are positioned immediately above each of said hinges.

17. The mirror subassembly according to claim 11, wherein at least part of said support comprises silicon.

18. The mirror subassembly according to claim 11, wherein at least part of said overlay comprises a plastic material.

19. The mirror subassembly according to claim 10, wherein said roughened surface prevents damage to the mirror subassembly by preventing slippage between the mirror stop and the mirror should the mirror contact said mirror stop.

\* \* \* \* \*